United States Patent
Schlemm et al.

(10) Patent No.: US 12,009,186 B2
(45) Date of Patent: Jun. 11, 2024

(54) DEVICE FOR TRANSPORTING SUBSTRATE, TREATMENT DEVICE WITH RECEIVING PLATE ADAPTED TO SUBSTRATE CARRIER OF A DEVICE OF THIS KIND, AND METHOD FOR PROCESSING A SUBSTRATE USING A DEVICE OF THIS KIND FOR THE TRANSPORT OF A SUBSTRATE, AND TREATMENT FACILITY

(71) Applicant: MEYER BURGER (GERMANY) GMBH, Hohenstein-Ernstthal (DE)

(72) Inventors: Hermann Schlemm, Milda (DE); Mirko Kehr, Amtsberg (DE); Erik Ansorge, Chemnitz (DE); Sebastian Raschke, Thalheim (DE)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 1077 days.

(21) Appl. No.: 16/625,459

(22) PCT Filed: Jun. 19, 2018

(86) PCT No.: PCT/EP2018/066192
§ 371 (c)(1),
(2) Date: Dec. 20, 2019

(87) PCT Pub. No.: WO2019/002014
PCT Pub. Date: Jan. 3, 2019

(65) Prior Publication Data
US 2021/0151302 A1    May 20, 2021

(30) Foreign Application Priority Data

Jun. 28, 2017  (EP) .................................... 17178276

(51) Int. Cl.
*H01J 37/32*     (2006.01)
*C23C 16/458*   (2006.01)
*C23C 16/509*   (2006.01)

(52) U.S. Cl.
CPC .... *H01J 37/32743* (2013.01); *C23C 16/4586* (2013.01); *C23C 16/509* (2013.01)

(58) Field of Classification Search
CPC .......... H01J 37/32743; H01J 37/32724; C23C 16/509; C23C 16/4586; C23C 16/4583;
(Continued)

(56) References Cited

U.S. PATENT DOCUMENTS 5,718,574 A   2/1998  Shimazu
5,855,681 A   1/1999  Maydan et al.
(Continued)

FOREIGN PATENT DOCUMENTS

DE   3214256 A1   10/1983
DE   10047983 A1  11/2001
(Continued)

OTHER PUBLICATIONS

International Search Report (and English translation) and Written Opinion of the International Searching Authority for International Application No. PCT/EP2018/066192 dated Aug. 28, 2018.

*Primary Examiner* — Yuechuan Yu
(74) *Attorney, Agent, or Firm* — Heslin, Rothenberg, Farley & Mesiti PC

(57) ABSTRACT

The invention relates to an apparatus for transporting a substrate into or out of a treatment apparatus, to a treatment apparatus, to a method of processing a substrate and to a treatment system having a movement arrangement for moving such an apparatus for transporting a substrate. In this case, the apparatus for transporting a substrate has a substrate carrier that includes a horizontally extending holding (Continued)

Figure 1A:
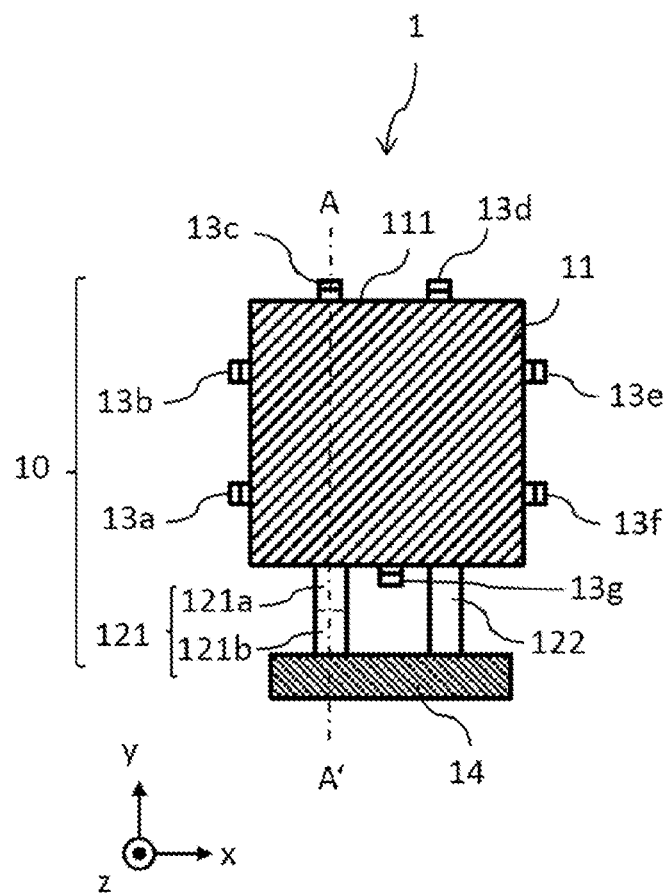

area and one or a plurality of gripping arms. The holding area is even and uniform on a first surface facing the substrate, the shape of said holding area substantially corresponding to the shape of the substrate and the area size of said holding area being substantially the same as the area size of the substrate, the substrate being held with its rear side on the holding area merely by its weight. The treatment apparatus has a receiving plate on which the substrate is held during the treatment, the receiving plate having a recess that is suitable for receiving such a substrate carrier during the treatment of the substrate in a first surface.

17 Claims, 18 Drawing Sheets

(58) Field of Classification Search
CPC ......... C23C 16/45565; H01L 21/67754; H01L 21/68785; H01L 21/68707; H01L 21/67748; H01L 21/67103
See application file for complete search history.

(56) References Cited

U.S. PATENT DOCUMENTS

| | | | |
|---|---|---|---|
| 5,893,760 A | 4/1999 | Mikata et al. | |
| 6,462,411 B1 | 10/2002 | Watanabe et al. | |
| 6,799,940 B2 | 10/2004 | Joe et al. | |
| 2003/0170583 A1 | 9/2003 | Nakashima et al. | |
| 2004/0109748 A1 | 6/2004 | Joe et al. | |
| 2007/0297876 A1* | 12/2007 | Sasajima | H01L 21/67109 414/160 |
| 2008/0099970 A1 | 5/2008 | Kushida et al. | |
| 2008/0273893 A1* | 11/2008 | Yamawaku | H01L 21/67051 399/101 |
| 2010/0273314 A1* | 10/2010 | Ishikawa | C23C 16/4583 257/E21.09 |
| 2012/0216743 A1 | 8/2012 | Itoh et al. | |
| 2012/0325145 A1* | 12/2012 | Satoyoshi | C23C 16/45546 118/719 |
| 2015/0187620 A1 | 7/2015 | Gurary et al. | |

FOREIGN PATENT DOCUMENTS

| | | |
|---|---|---|
| DE | 102008019023 A1 | 4/2009 |
| DE | 102010026209 A1 | 1/2012 |
| EP | 0099575 A2 | 2/1984 |
| EP | 0189279 A2 | 1/1986 |
| EP | 0843340 A2 | 5/1998 |
| EP | 2915901 A1 | 9/2015 |
| JP | H11163102 A | 6/1999 |
| JP | 2005223142 A | 8/2005 |
| JP | 2009212335 A | 9/2009 |
| WO | 2013/115957 A1 | 8/2013 |

\* cited by examiner

DEVICE FOR TRANSPORTING SUBSTRATE, TREATMENT DEVICE WITH RECEIVING PLATE ADAPTED TO SUBSTRATE CARRIER OF A DEVICE OF THIS KIND, AND METHOD FOR PROCESSING A SUBSTRATE USING A DEVICE OF THIS KIND FOR THE TRANSPORT OF A SUBSTRATE, AND TREATMENT FACILITY

CROSS REFERENCE TO RELATED APPLICATIONS

This application is a national stage filing under section 371 of International Application No. PCT/EP2018/066192, filed on Jun. 19, 2018, and published on Jan. 3, 2019 as WO 2019/002014, which claims priority to European Application No. 17178276.6, filed on Jun. 28, 2017. The entire contents of WO 2019/002014 are hereby incorporated herein by reference.

The invention relates to an apparatus for transporting a substrate with which a flat substrate or a lateral arrangement of a plurality of flat substrates can be moved into or out of a treatment apparatus and on which the substrate(s) are stored in a horizontal position during the treatment and to a treatment apparatus having a receiving plate that is suitable for receiving a substrate carrier of the apparatus for transporting a substrate and for holding said substrate carrier as well as the substrate(s) arranged on the substrate carrier during a treatment of the substrate. In this case, the receiving plate is designed in such a way that the receiving plate and the substrate carrier cooperate while the substrate is being treated in the treatment apparatus. Furthermore, the invention relates to a method of processing one or a plurality of substrates using such an apparatus for transporting a substrate and to a corresponding treatment system.

In solar cell manufacturing, microelectronics or the refinement of substrate surfaces (e.g. glass), various processes are used to deposit or remove layers or particles, to dope layers or for cleaning or activating the surface of a substrate. In the following, all these processes are referred to as the treatment of a substrate. Often, a plurality of such processes is carried out directly one after the other, with or without interrupting the vacuum, a separate treatment apparatus usually being used for each of the processes in each case. The totality of all the steps necessary for treating a substrate, such as the introduction of a substrate into the treatment apparatus, the actual treatment of the substrate and the removal of the substrate from the treatment apparatus and, if appropriate, the transfer of the substrate between a plurality of treatment apparatuses, will be referred to as the processing of a substrate hereinafter.

Usually, flat substrates that have a large area size in a plane and, in contrast, only a low thickness or height in a direction perpendicular to this plane are treated. For example, solar cell substrates have an area of (156×156) $mm^2$ with a substrate thickness between 140 µm and 200 µm.

For a substrate treatment in which only one of the flat surfaces of the substrate, hereinafter referred to as the substrate upper side, is treated, a substrate is often placed horizontally onto a receiving plate within a treatment apparatus with the other of the two flat surfaces, hereinafter referred to as the substrate rear side. This receiving plate can be temperature-controlled to create optimal conditions, for example, for vapour deposition, in particular chemical vapour deposition (CVD). Alternatively or additionally, an electrical voltage can be applied to the receiving plate such that the receiving plate serves as an electrode of a plate capacitor in a parallel plate reactor, between the electrodes of which a plasma is generated. In both cases, a uniform, flat support of the substrate rear side on the receiving plate is of particular importance for the homogeneity of the substrate treatment.

For the purpose of placing the substrate onto or picking it up from the receiving plate, various methods and apparatuses, hereinafter referred to as a handling system, are known. For one, the substrate can be picked up from the substrate front side by a handling system. For this purpose, the Bernoulli effect is often used, with which non-contact holding of the substrate is, in principle, possible. Magnetic effects can also be used in the case of corresponding substrates or additional substrate supports. However, Bernoulli grippers in particular have a large overall height that makes it difficult to use them in treatment apparatuses having a small vertical distance between the receiving plate and other, overlying components, or they result in an uneven load on the substrate for large-area substrates, which can cause the substrate to break. In addition, most such 'non-contact' grippers have contact elements that are intended to ensure a distance between the substrate upper side and the gripper and touch the substrate upper side. As a result, damage to the substrate upper side is possible. Such grippers are described, for example, in DE 10 2010 026 209 A1.

Another possibility for placing or picking up the substrate is the use of a lateral gripper that engages the edge of the substrate at a plurality of points. Such grippers are described, for example, in EP 0 189 279 A2 and DE 100 47 983 A1. The substrate can also be broken here, in particular in the case of thin substrates having a large area.

Furthermore, there is the possibility of handling, i.e. moving, placing or transferring, the substrate on a substrate carrier that engages the substrate at the underside of the substrate. Such substrate carriers have one or a plurality of support arms that are arranged in a fork-shaped manner on which the underside of the substrate rests during the handling. In order to pick up such a substrate from a receiving plate or to place it thereon, the receiving plate, for example, has recesses into which the one or more support arms are inserted. This is described in DE 32 14 256 C2. Another variant is the presence of an additional lifting mechanism that consists of, for example, pins that extend through the receiving plate. Said lifting mechanism lifts the substrate off the support arm(s) or the receiving plate and makes it possible to move the support arm(s) below the substrate underside such that the substrate can be lifted off the receiving plate and placed on the support arm(s) or lifted off the support arm(s) and placed on the receiving plate. Such a lifting mechanism is described, for example, in EP 0 843 340 A2. In both cases, the substrate carrier is completely outside the treatment apparatus during the substrate treatment. These systems have the disadvantage that the receiving plate is interrupted during the treatment of the substrate in a substrate supporting region, thus making it impossible, for example, to uniformly control the temperature of the substrate or to uniformly apply a voltage to the receiving plate, which has a negative effect on the homogeneity of the substrate treatment.

In all the described methods and handling systems, the substrate is deposited on the receiving plate with the aid of the handling system and received by said handling system again after the treatment, whereas the handling system is located outside the treatment apparatus during the substrate treatment itself. Moreover, it is not possible or at least very difficult to ensure that substrates that were broken during the treatment are completely removed from the receiving plate.

Because thin substrates and substrates having a multicrystalline structure are relatively frequently subjected to such breakage (between one and one hundred broken wafers in a treatment apparatus per day), this is a major disadvantage of known handling systems. In addition, stationary handling systems, such as a robotic arm arranged between a loading station and a treatment chamber, have only a limited substrate movement range, in particular a limited number of treatment apparatuses achievable with the handling system.

To increase the throughput of substrates in a treatment, batch systems in which a plurality of substrates are simultaneously treated are used. In this case, the substrates having the surface to be processed can be arranged next to each other or one above the other on one or a plurality of receiving plates. For example, the substrates can be arranged on vertically stacked and, in each case, horizontally extending receiving plates that serve as electrodes of a parallel plate reactor.

In this case, the substrates can be introduced into the treatment apparatus and placed on the respective receiving plates one after the other using the handling systems described above or at the same time with the aid of a plurality of the handling systems described above. This is disclosed, for example, in WO 2013/115957 A1. However, this results in several disadvantages or challenges. Thus, for example, individually loading or unloading the substrates requires a great deal of time during which the treatment apparatus is not available for treatment, whereas combined handling systems become very expensive for a large number of substrates to be transferred simultaneously.

In batch systems, the substrates are therefore often loaded into a substrate holding device, such as a wafer or process boat, outside a treatment chamber in which the treatment apparatus is arranged and under atmospheric conditions, i.e. in air, and introduced into the treatment chamber with this substrate holding device. This is employed in particular in plasma processes in which each substrate electrically contacts a receiving plate acting as an electrode of a parallel plate reactor. For this purpose, a large part of the treatment apparatus, namely an electrode unit having the electrodes, is supplied with the substrates outside the treatment chamber and then introduced into the treatment chamber for the substrate treatment. This is described, for example, in DE 10 2008 019 023 A1 and DE 10 2010 026 209 A1.

A disadvantage of this type of batch system is that the substrate holding device as a whole has to be heated or cooled to reach a temperature of the substrates that is required for the substrate treatment and is usually high (200° C. to 450° C. for plasma processes and up to 1000° C. for CVD processes) or to reach the low temperature of the substrates that may be required for further transport of the substrates to a subsequent treatment system or a storage system. In particular for large substrates in which the substrate holding device is likewise large-sized and the thickness of the individual elements of the substrate holding device is also sufficiently large to ensure mechanical stability, the substrate holding device thus constitutes a large thermal mass that results in a prolongation of the process duration and a significant thermal load (thermal budget) of the substrates, which is particularly unfavourable in the presence of doped layers or regions, and overall in high energy consumption in the process due to the long heating and cooling time.

If a substrate holding device having the substrates loaded therein is used for various, successive substrate treatments in different treatment apparatuses, the substrate holding device as a whole is transported from a first treatment apparatus to the second treatment apparatus that follows in the process line. Thus, transferring the substrates to a further substrate holding device with the necessary cooling of the substrates and the heating of the substrates and of the further substrate holding device is avoided. However, parasitic layers that have formed on the substrate holding device in the first treatment apparatus are also simultaneously introduced into the second treatment apparatus, as a result of which cross-contamination between the two treatment apparatuses with undesirable effects on the substrate treatment can occur. In particular, a process sequence having a doping process, for example of semiconductor layers, and a subsequent doping process of a different kind or a subsequent process for depositing an undoped layer results in negative effects. However, even a vacuum interruption, during which the substrate holding device is transported in normal ambient air, can result in the introduction of unwanted particles and the absorption of contaminating gases from the air into the second treatment apparatus and thus to an increased effort to eliminate these particles and gases. These cross-contamination effects increase with the size of the exposed areas of the substrate holding device.

The object of the invention is therefore to provide an apparatus for transporting a substrate with which a flat substrate can be moved into or out of a treatment apparatus of a treatment system and horizontally positioned on a receiving plate in the treatment apparatus, a treatment apparatus having a receiving plate that is suitable for receiving the substrate and holding it during the substrate treatment, and a method of processing a substrate in a treatment apparatus as well as a treatment system in which the disadvantages of the prior art are avoided or reduced.

The object is achieved by an apparatus for transporting a substrate according to claim 1, by a treatment apparatus according to claim 12, by a method according to claim 21 and by a treatment system according to claim 25. Advantageous embodiments can be found in the dependent claims.

The apparatus according to the invention for transporting a substrate is used, on the one hand, to transport the substrate into or out of a treatment apparatus, the treatment apparatus having a horizontally extending receiving plate and, on the other hand, to position and hold the substrate on a first surface of the receiving plate. In this case, the apparatus is suitable for holding the substrate on the receiving plate in the treatment apparatus while the substrate is being treated. For this purpose, the apparatus has a substrate carrier that includes a holding area and one or a plurality of gripping arms.

The holding area extends horizontally and is designed so as to be even and uniform on a first surface facing the substrate. This means that the holding area, at least on the first surface on which the substrate rests, consists of one and the same material, has no recesses or holes, no holes filled with a material, and no projections. In other words: The holding area is, at least on its first surface, a monolithic structure having a flat surface. In this case, the holding area has a shape and an area size that substantially correspond to the shape and the area size of the substrate. "Substantially" means that slight deviations from the shape and area size of the substrate still constitute a corresponding shape and area size. Thus, the area size of the holding area is, for example, at most 5% smaller or larger than that of the substrate. Areas that are likewise "substantially" equal in size result from a lateral distance of an edge of the holding area from the edge of the substrate that is less than or equal to 4 mm. The area of the holding area in the specified ranges is preferably less than or at most equal to the area size of the substrate. The substrate is held with its rear side on the holding area merely by its weight, which rear side is the flat surface of the substrate that is not to be treated. No further forces, for example, from suction, clamps or the like, are actively exerted on the substrate.

The one or more gripping arms are connected to the holding area and extend beyond said holding area in the horizontal direction. The one or more gripping arms can be connected to the holding area at the edge of the holding area or on the rear side of the holding area opposite the first surface of the holding area. They can, for example, be glued, welded or otherwise detachably or non-detachably connected to the holding area. A one-piece configuration of the gripping arms and the holding area is also possible, the holding area and the gripping arms being produced, for example, by means of machining processes or etching from a common piece of material or in a common manufacturing process, for example, by means of casting. The one or more gripping arms serve to connect the holding area to a manipulator for moving the substrate carrier. Each gripping arm has a width and a length, the length being measured along a horizontal connecting line between the holding area and the manipulator and the width being measured orthogonally to the length but in the same horizontal plane. The dimensions of the gripping arms and the number thereof are dimensioned in such a way that stable and secure holding and movement of the holding area with a substrate resting thereon is ensured and thus depend on the shape and area size as well as the weight of the holding area with a substrate resting thereon. In regions where the gripping arms are in contact with the receiving plate of the treatment apparatus and not covered by a substrate resting on top during a substrate treatment, the gripping arms are thus exposed to a similar treatment as the substrate. At least in these regions, the width of the gripping arms is minimised to the extent that the guarantee of mechanical stability and the fulfilment of the function of the substrate carrier allow this. Thus, the sum of the widths of all the gripping arms is substantially smaller than the maximum extent of the holding area in the horizontal plane. Preferably, the sum of the widths of all the gripping arms is smaller than the maximum extent of the holding area by a multiple, for example by a factor of 10.

The substrate carrier of the apparatus according to the invention makes a plurality of advantages possible in the processing of a substrate: The design of the holding area as a uniform, planar surface substantially having the same shape and size as the substrate on which surface the substrate is held merely by its own weight prevents uneven or additional forces from acting on the substrate such that the risk of breakage is reduced and allows the homogeneity of the treatment of the substrate to be improved. In addition, a substrate that has been damaged during the treatment and is, for example, broken can be easily removed from the treatment apparatus and transported. Furthermore, because the substrate remains on the substrate carrier during the treatment and does not need to be removed from the substrate carrier prior to treatment and placed back onto the substrate carrier after treatment, two critical steps are eliminated, thereby reducing the risk of substrate damage and saving time. Because the holding area substantially has the same shape and area size as the substrate and because the dimensions of the gripping arms are as small as possible in a treatment region, i.e. where no substrate covers the gripping arms and the gripping arms are in contact with the receiving plate, the regions of the substrate carrier that undergo a treatment similar to that of the substrate are kept to a minimum. Thus, cross-contamination between different treatment apparatuses in which the substrate is held on the same substrate carrier is reduced or a rearrangement onto another substrate carrier for transport to another treatment apparatus becomes superfluous and the associated possible damage to the substrate is avoided.

The substrate carrier preferably includes at least two holding devices that extend at least in the vertical direction from the edge and/or from the first surface of the holding area, are detachably or non-detachably connected to said holding area and are suitable for securing the substrate against lateral displacement, for example slipping or twisting, on the holding area, in particular in the case of rapid movements of the substrate carrier in a horizontal direction. The holding devices extend beyond the first surface of the holding area up to a height that is preferably greater than zero and less than or equal to the height of the substrate. The height of the holding devices is measured from the first surface of the holding area. The holding devices preferably have a length and width that are substantially smaller than the length and width of the substrate. Thus, the treatment of the substrate is only slightly influenced by the holding devices. Because the holding devices or the regions thereof, which undergo a treatment similar to that of the substrate, have only very small dimensions, they also have little influence on cross-contamination caused by the apparatus for transporting a substrate.

In a particular embodiment, the substrate carrier is suitable for transporting a plurality of substrates. For this purpose, said substrate carrier has a plurality of holding areas that are arranged next to each other in a lateral arrangement in a common horizontal plane and are physically connected to each other. The physical connection results in a rigid mechanical connection between the various holding areas. The physical connection of the holding areas in their entirety is, in turn, connected to one or a plurality of gripping arms such that all the holding areas can be moved simultaneously using the manipulator engaged to the gripping arm(s). In this case, the substrate carrier preferably has a closed base body, each holding area being realised as the base surface of a recess that is formed in a horizontal surface of the base body. In order to secure the substrates, each of which rests on one of the holding areas, against lateral displacement, for example slipping or twisting, on the respective holding area, holding devices are provided that are designed, for example, as a side frame or as a web between the holding areas.

Preferably, the components of the substrate carrier consist of the same material as the first surface of the receiving plate, at least in the regions that are in contact with the substrate and/or the receiving plate during the substrate treatment. In a particularly preferred embodiment, the components of the substrate carrier consist of an electrically conductive material in the regions that are in contact with the substrate and/or the receiving plate during the substrate treatment, whereas the gripping arm(s) consist(s) of a dielectric material in regions that are not in contact with the receiving plate during the substrate treatment. This has the advantage that a manipulator connected to the gripping arms can be at a potential, for example earth, independent of the potential of the receiving plate and, for example, parasitic plasmas can largely be avoided in the region of the gripping arms.

Preferably, the regions of the substrate carrier that are in thermal contact with the substrate(s) and/or the receiving plate during the substrate treatment have as small a heat capacity as possible that is as small as possible relative to the heat capacity of the receiving plate to allow rapid temperature equalisation to the temperature of the heated receiving plate. In this case, the heat capacity of these regions of the substrate carrier is minimised by a corresponding selection of the material of the substrate carrier and of the dimensions of the regions, i.e. in particular the height of the holding area and the gripping arms. This has the advantage that these regions of the substrate carrier and the substrate resting on the holding area can be rapidly heated or cooled, as a result of which the substrate rapidly assumes the temperature required or desired for the treatment in the treatment apparatus and, after treatment, can be rapidly returned to a temperature that is advantageous for further processing.

The apparatus preferably has a carrier arrangement to which the substrate carrier having the one or more gripping arms is fastened. The carrier arrangement can be connected to a manipulator for moving the substrate carrier.

In one embodiment, the apparatus includes a plurality of substrate carriers that are vertically stacked and connected to the carrier arrangement and form a unit. In this case, all the substrate carriers are preferably identical in design. The carrier arrangement is, for example, a vertically extending plate or bar to which the gripping arms of the individual substrate carriers are fastened. Thus, using the carrier arrangement, a common, simultaneous and identical movement of all the substrate carriers is ensured such that a plurality of substrates can simultaneously be moved into or out of a treatment apparatus having a plurality of vertically stacked receiving plates, be positioned on the receiving plates and be held during the treatment of the substrates. In this case, the vertical distance between the individual substrate carriers corresponds to the vertical distance between the individual receiving plates of the treatment apparatus.

The apparatus preferably comprises a plurality of units of vertically stacked substrate carriers, the units being arranged next to each other in the horizontal direction and being connected to the same carrier arrangement. Thus, the simultaneous movement of a plurality of substrate units, the substrates of a particular substrate unit resting on the holding areas of a particular unit of substrate carriers, into or out of a plurality of treatment apparatuses arranged next to each other in the horizontal direction is possible, it being possible for the plurality of treatment apparatuses to be identical or different. Of course, a treatment apparatus can also include a plurality of units of vertically stacked receiving plates, wherein said units are arranged horizontally next to each other.

Of course, the apparatus can also have a plurality of substrate carriers that are arranged next to each other in the horizontal direction but not above each other and connected to the carrier arrangement.

The treatment apparatus according to the invention for treating a substrate has a receiving plate on which the substrate is held during treatment. This receiving plate has, in a first surface that faces the substrate during the substrate treatment, a recess that is suitable for receiving a substrate carrier of the apparatus according to the invention for transporting a substrate during the treatment of the substrate. For this purpose, the dimensions and the shape of the recess are designed according to the dimensions and the shape of the substrate carrier. This means that the dimensions and shape of the holding area, the dimensions, shape and configuration of the gripping arms and, if appropriate, the dimensions, shape and configuration of the holding devices as well as, if appropriate, the configuration of a plurality of holding areas are taken into account in the design of the recess in the receiving plate. In other words: A receiving plate of the treatment apparatus according to the invention is designed such that a substrate carrier of a certain apparatus according to the invention for transporting a substrate 'fits' in the recess of the receiving plate in a form-fitting manner. The recess of the receiving plate thus forms a negative of the surface of the substrate carrier facing the receiving plate. In this case, the recess is designed in such a way that the substrate carrier is completely received in the recess, i.e. "fits" in the recess, at least in the horizontal plan view, if the substrate carrier is, during the substrate treatment, heated to a temperature of the receiving plate that is often a higher temperature compared to the normal temperature. In this case, 'normal temperature' means the temperature at which the dimensions of the substrate carrier are usually measured, for example at room temperature, i.e. approximately 20° C. In other words: The thermal expansion of the substrate carrier and the receiving plate and the temperature of the receiving plate during the substrate treatment must be taken into account in the design and creation of the recess in the receiving plate.

Together with a substrate carrier having a minimal surface to be coated, such a design of the receiving plate of the treatment apparatus allows further reduction of cross-contamination between different treatment apparatuses in which the substrate is held on the same substrate carrier according to the invention because the deposition of layers that would cause cross-contamination can only take place in a minimal area. Because substantially only the holding devices of the substrate carrier contribute to cross-contamination and their area can amount to, for example, only 0.1 to 1% of the total area of the receiving plate, the cross-contamination of two successive coating processes can be reduced, for example, by 3 to 4 orders of magnitude. This allows, for example, the deposition of doped and undoped (intrinsic) semiconductor layers in a system having a circulating substrate carrier, i.e. a substrate carrier that is shared at least for the two coating processes and/or a substrate carrier that is used for a plurality of passes through the system without interim cleaning of the substrate carrier. In addition, this configuration of the receiving plate offers the possibility of establishing full electrical and/or thermal contact with the substrate carrier with its rear side via the receiving plate and thus achieving a homogeneous potential distribution and/or homogeneous temperature control of the holding area.

Preferably, the recess in the first surface of the receiving plate has a depth measured from the first surface of the receiving plate that is dimensioned such that the first surface of the holding area of the substrate carrier and the first surface of the receiving plate form an even surface during the substrate treatment. Thus, the receiving plate and the holding area of the substrate carrier form an even surface on which the substrate rests completely flatly during its treatment such that the homogeneity of the substrate treatment is further increased.

In one embodiment, the treatment apparatus is a plasma treatment apparatus and further comprises an apparatus for applying a first voltage to the receiving plate and a second voltage to a first electrode that is arranged above the receiving plate in the vertical direction and parallel thereto and is electrically insulated from the receiving plate. The receiving plate is thus a second electrode in a parallel plate reactor consisting of the first electrode and the receiving plate. The first and the second voltage are different from each other here. Thus, a plasma can be ignited between the first electrode and the receiving plate and the substrate can be treated by means of a plasma-assisted process. If a plurality of receiving plates are vertically stacked in the treatment apparatus, each of the receiving plates is preferably alternately supplied with the first or the second voltage by the apparatus for applying a voltage. Thus, each receiving plate that is arranged above another receiving plate in the vertical direction forms the first electrode within a plate capacitor that consists of this receiving plate and the receiving plate arranged directly below. An additional first electrode is only necessary above the uppermost receiving plate of the treatment apparatus if a substrate arranged on the uppermost receiving plate is also to be treated.

Preferably, the receiving plate of the plasma treatment apparatus consists entirely of an electrically conductive material such that ohmic contact with the substrate carrier, and with the substrate in the case of a substrate carrier consisting of an electrically conductive material, is possible.

In another preferred embodiment, the receiving plate of the plasma treatment apparatus comprises a layer structure of an electrically conductive material and a dielectric material at least in a region adjacent to the first surface, the dielectric material being adjacent to the first surface of the receiving plate. Capacitive contact with the substrate carrier and the substrate can thus be established.

Preferably, the receiving plate includes a device for controlling the temperature of the receiving plate, which device serves to set a temperature desired, for example, for the substrate treatment. This device is preferably a heating device but can also be a cooling device. In this case, the device for temperature control can, for example, be designed as a resistive heating element or as a pipe system through which fluid flows or in the form of other devices known from the prior art.

In addition, the receiving plate can also include other devices, such as a device for feeding one or a plurality of process gases into a treatment space of a substrate. If a plurality of receiving plates are vertically stacked in the treatment apparatus, then, for example, each receiving plate that is arranged above another receiving plate in the vertical direction, preferably includes a gas distributor that is suitable for supplying one or a plurality of gases from the rear side of the receiving plate to a space above a receiving plate arranged under this receiving plate. Thus, each receiving plate simultaneously forms the gas supply for a treatment of a substrate that rests on the receiving plate arranged directly below.

The treatment apparatus is preferably a CVD coating system. The receiving plate includes an area heater in a vertically upper region, which area heater is suitable for heating the upper region to a first temperature, and a gas distributor in a vertically lower region, which gas distributor has means for bringing the temperature of the lower region to a second temperature, the second temperature being lower than the first temperature. An arrangement for thermal insulation is arranged between the upper and the lower region, which arrangement for thermal insulation is suitable for reducing or preventing heat flow from the upper region to the lower region.

Preferably, the recess in the first surface of the receiving plate has a shape that allows self-adjustment of the substrate carrier in the recess, in particular while the substrate carrier is being placed on the receiving plate. Thus, for example, the downward edges of the recess can extend obliquely.

Preferably, the treatment apparatus has a plurality of superposed receiving plates, each of which is suitable for receiving a substrate carrier of the apparatus according to the invention for transporting a substrate, which apparatus includes a unit of vertically stacked substrate carriers. In this case, the vertical distances of the receiving plates and the vertical distances of the substrate carrier are adapted to each other.

The method according to the invention for processing a substrate in a treatment system that includes a treatment apparatus having a receiving plate on which the substrate is held during treatment has the following steps in the order specified: Placing the substrate onto a substrate carrier of an apparatus according to the invention for transporting a substrate, moving the substrate carrier in at least one horizontal direction until the substrate carrier is arranged above a receiving plate of the treatment apparatus in the vertical direction, placing the substrate carrier on the receiving plate, treating the substrate in the treatment apparatus, lifting the substrate carrier off the receiving plate in the vertical direction, moving the substrate carrier out of the treatment apparatus in at least one horizontal direction and removing the substrate from the substrate carrier. The substrate is placed onto the substrate carrier and removed from the substrate carrier using means known from the prior art. The movement of the substrate carrier in the horizontal direction and in the vertical direction for placing the substrate carrier on the receiving plate and for lifting the substrate carrier off the receiving plate is carried out with the aid of a manipulator having means known from the prior art. The horizontal and vertical movements of the substrate carrier are preferably clearly separated from one another temporally. If there is sufficient space within the treatment apparatus, the horizontal movement and the vertical movement can also, at least in part, be combined. In this case, for example, a corkscrew movement of the substrate carrier can also be used.

The treatment system preferably has a plurality of treatment apparatuses, and the steps for moving the substrate carrier in at least one horizontal direction until the substrate carrier is arranged above a receiving plate of the treatment apparatus in a vertical direction, placing the substrate carrier on the receiving plate, treating the substrate in the treatment apparatus, lifting the substrate carrier off the receiving plate in the vertical direction and moving the substrate carrier out of the treatment apparatus in at least one horizontal direction are performed as a unit a plurality of times in succession, the substrate being successively introduced into and removed from various treatment apparatuses and treated therein. Thus, the substrate is on the same substrate carrier throughout the entire processing in the treatment system and is transported therewith from one treatment apparatus to the next treatment apparatus and placed on the respective receiving plate and treated in each treatment apparatus. Thus, transferring (reloading) the substrate between different treatment apparatuses is avoided, while the problems of cross-contamination and the possibly necessary, time-consuming temperature control of the substrate between different treatment processes are significantly reduced.

The substrate treatments in the various treatment apparatuses and the transport operations of the substrate between the various treatment apparatuses are preferably carried out without interrupting a vacuum in the treatment system. This reduces the introduction of particles into the treatment apparatuses, which saves time and money.

In a particularly preferred embodiment, the treatment apparatus is a treatment apparatus according to the invention as described above. That is, the receiving plate has a recess corresponding to the substrate carrier. In this case, the substrate carrier is placed in the recess of the receiving plate.

However, an apparatus according to the invention for transporting a substrate can also be combined with a treatment apparatus, the receiving plate of which treatment apparatus has no such recess, for processing a substrate. In this case, the gripping arms of the substrate carrier are preferably arranged, i.e. designed or fastened, only on the side surfaces or the edge of the holding area such that the rear side of the substrate carrier, which is placed on the receiving plate of the treatment apparatus, is even and has no projecting parts or recesses. Thus, the holding area of the substrate carrier lies flatly on the planar surface of the receiving plate during the substrate treatment. It is already possible to achieve a reduction in the cross-contamination as well as full-area electrical and/or thermal contacting of the substrate carrier with its rear side via the receiving plate and thus a homogeneous potential distribution and/or homogeneous temperature control of the holding area in this embodiment as well.

The treatment system according to the invention for processing a substrate has a loading chamber, at least one treatment chamber having at least one treatment apparatus and an unloading chamber as well as a movement arrangement. The treatment apparatus has a receiving plate on which the substrate is held during treatment. The movement arrangement is suitable for receiving an apparatus according to the invention for transporting a substrate and for moving it into and out of the at least one treatment chamber as well as for moving a substrate carrier of the apparatus for transporting a substrate within the treatment chamber in at least one horizontal direction and in the vertical direction. The movement arrangement thus serves to move the substrate carrier having the substrate arranged thereon into and out of the at least one treatment apparatus and to place the substrate carrier onto and lift the substrate carrier off the receiving plate of the treatment apparatus. The loading chamber is suitable for placing the substrate onto the substrate carrier of the apparatus according to the invention for transporting the substrate, whereas the unloading chamber is suitable for removing the substrate from the substrate carrier. These chambers are preferably closed chambers that are surrounded on all sides by chamber walls but can also be open chambers in the sense of a loading or unloading station open to the environment. The loading and unloading chambers can be provided with or connected to a handling system known from the prior art that realises the placement of the substrate onto or the removal of the substrate from the substrate carrier. Moreover, the loading and unloading chambers can also be designed as a single chamber that is suitable both for placing the substrate onto a substrate carrier and for removing the substrate from the substrate carrier.

Preferably, at least one treatment apparatus is a treatment apparatus according to the invention as described above. That is, the receiving plate has a recess corresponding to the substrate carrier.

The at least one treatment chamber is preferably a closed chamber in which defined process conditions can be set for the treatment of the substrate. If a plurality of treatment chambers are present, different treatment chambers can be designed differently.

The various chambers can be arranged in any way, provided that their functionality and the movement of the apparatus for transporting a substrate are ensured. The individual chambers are preferably arranged linearly one behind the other, the system being designed as a continuous system in a particularly preferred embodiment. However, it is also possible to arrange a plurality of treatment chambers around a central chamber in a non-linear manner, it being possible for the central chamber to be a combined loading and unloading chamber or a separate handling chamber.

Preferably, one of the at least one treatment chambers is a vacuum chamber that is separated from an adjacent chamber by a gastight slide valve, the slide valve having a cross section that is sufficiently large for the apparatus for transporting a substrate to pass through. The chambers adjacent to this vacuum chamber can be chambers in which a vacuum can likewise be generated such that these adjacent chambers can be used as an introduction chamber in which a vacuum atmosphere is generated from an environment at atmospheric pressure or as a discharge chamber in which an environment at atmospheric pressure is generated from a vacuum atmosphere. The loading and unloading chambers can also be used as such introduction and discharge chambers.

In a preferred embodiment, the treatment system has a plurality of treatment chambers that are each vacuum chambers and interconnected by means of gastight slide valves. In this case, the movement arrangement is suitable for moving the device for transporting a substrate through all the treatment chambers without interrupting the vacuum. Thus, pumping-out and aeration processes in the various treatment chambers between individual treatment steps and the associated disadvantages are avoided.

Preferably, at least the at least one treatment chamber is a chamber having a straight, vertical side wall that is perpendicular to a wall or slide valve that adjoins an adjacent chamber, for example the loading chamber and/or the unloading chamber. In this embodiment, the movement arrangement includes a carrier unit, at least one guidance system extending in the horizontal or vertical direction and a plurality of guide elements. The guidance system is arranged on the carrier unit on the side facing the side wall, whereas the guide elements are arranged on the vertical side wall of the treatment chamber and are suitable for cooperating with the guidance system in such a way that the carrier unit is guided along the side wall in the horizontal or vertical direction and held by means of the guide elements. On the side of the carrier unit facing away from the side wall of the treatment chamber, the carrier unit is mechanically connected to the apparatus for transporting a substrate, in particular to the gripping arm(s) of a substrate carrier or to a carrier arrangement. Said carrier unit is suitable for moving the substrate carrier of the apparatus for transporting a substrate at least in a direction orthogonal to the direction in which the guidance system extends. For this purpose, said carrier unit has movement devices that are driven and controlled electrically, pneumatically, hydraulically or in another manner, such as sliding rods, which are known from the prior art.

Preferably, the carrier unit is suitable for moving the substrate carrier along a horizontal direction that is orthogonal to the side of the carrier unit that faces the apparatus for transporting a substrate.

In one embodiment, the guidance system extends vertically along the carrier unit and the guide elements extend vertically along the side wall of the treatment chamber. The adjacent chambers are arranged above or below the treatment chamber in the vertical direction. In this case, a vertical movement of the apparatus for transporting the substrate is realised by the guidance system in cooperation with the guide elements, whereas a horizontal movement of the apparatus for transporting the substrate is realised by the carrier unit.

In another embodiment, the guidance system extends horizontally along the carrier unit and the guide elements extend horizontally along the side wall of the treatment chamber. The adjacent chambers are arranged next to the treatment chamber in the horizontal direction. In this case, the guidance system implements a movement of the apparatus for transporting the substrate in a horizontal direction that is along the vertical side wall of the treatment system in cooperation with the guide elements, whereas the carrier unit implements a vertical movement of the apparatus for transporting the substrate and possibly a movement of the apparatus for transporting the substrate along a horizontal direction that is orthogonal to the side of the carrier unit facing the apparatus for transporting a substrate.

In this embodiment, the guidance system preferably includes a rail that is arranged on the carrier unit in the horizontal direction, whereas the guide elements preferably include rollers that are arranged rotatably and one behind the other in the horizontal direction on the side wall. In this case, the rollers are each arranged at a distance from one each other that is so small that the rail is in contact with and held by at least two rollers at any location within the treatment system. The dimension of the gastight slide valves in the direction of travel of the carrier unit must thus be smaller than the roller spacing.

The apparatus according to the invention for transporting a substrate is preferably an integral part of the treatment system. That is, the apparatus is used only in the treatment system and not in other treatment systems and is adapted to the specific features of the treatment system.

In one embodiment of the treatment system, the loading chamber, the at least one treatment chamber and the unloading chamber are arranged in a linear sequence. This means that the chambers are arranged one behind the other along a line in the order listed. The movement arrangement is suitable for unidirectionally moving the apparatus for transporting a substrate from the loading chamber to the unloading chamber through the at least one treatment chamber. A substrate is thus moved and processed along the line through the various chambers. Such a treatment system is thus a continuous system in which the loading and unloading chamber are separate chambers that are often arranged at a large spatial distance from each other. The movement arrangement further includes a return system that is suitable for transporting the apparatus for transporting a substrate from the unloading chamber to the loading chamber outside the at least one treatment chamber. This makes it possible to return an empty apparatus for transporting a substrate, i.e. an apparatus in which a substrate no longer rests on the substrate carrier, from the unloading chamber to the loading chamber such that it is available to process a substrate in the treatment system again.

Figure 1B:
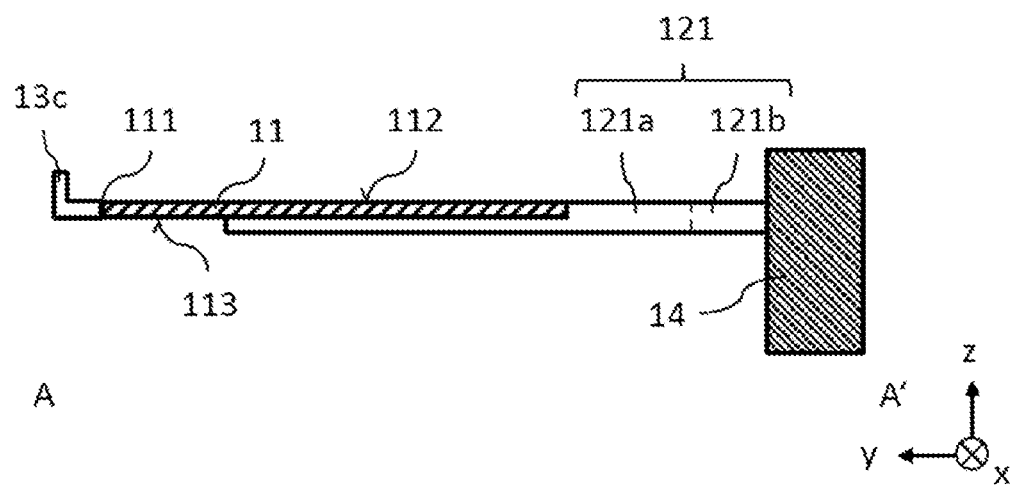
Figure 1C:
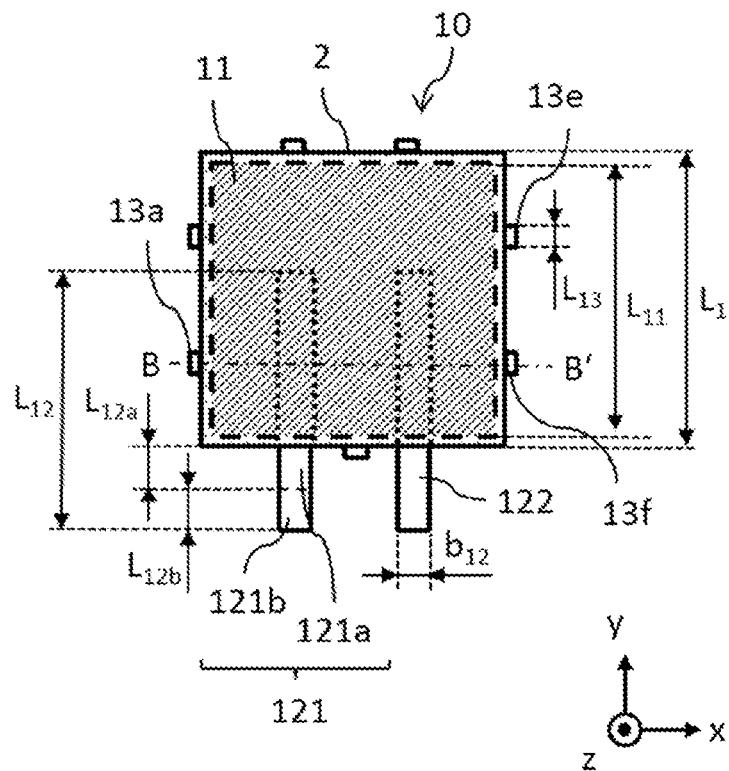
Figure 1D:
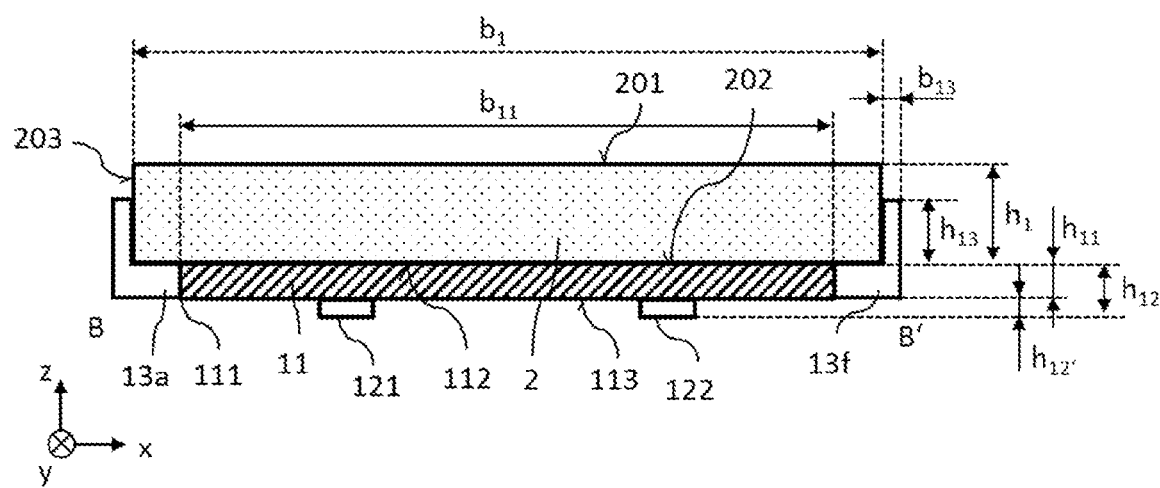
Figure 2A:
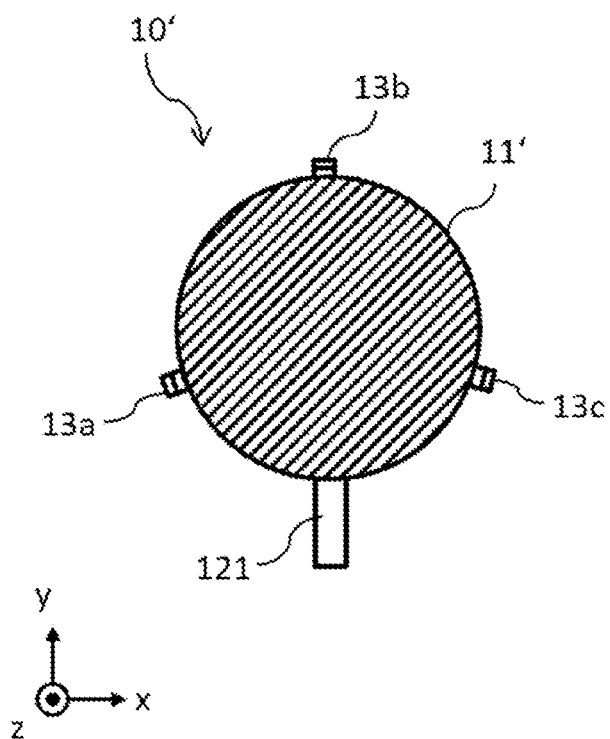
Figure 2B:
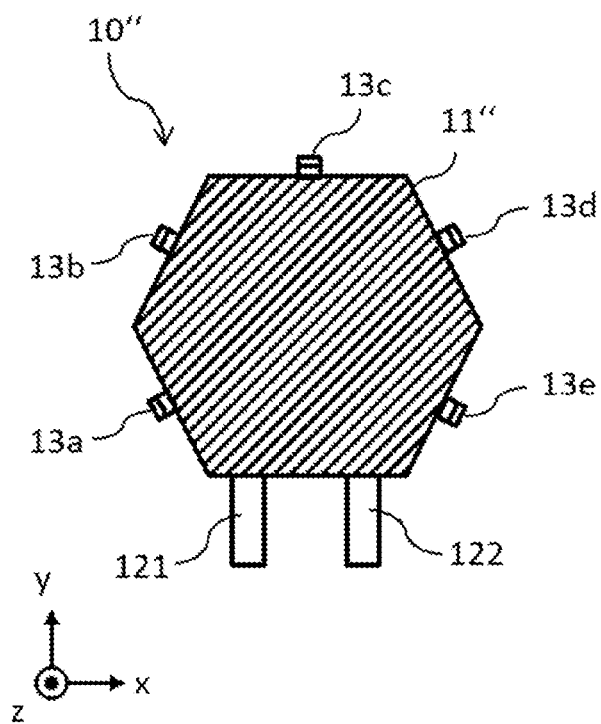
Figure 3A:
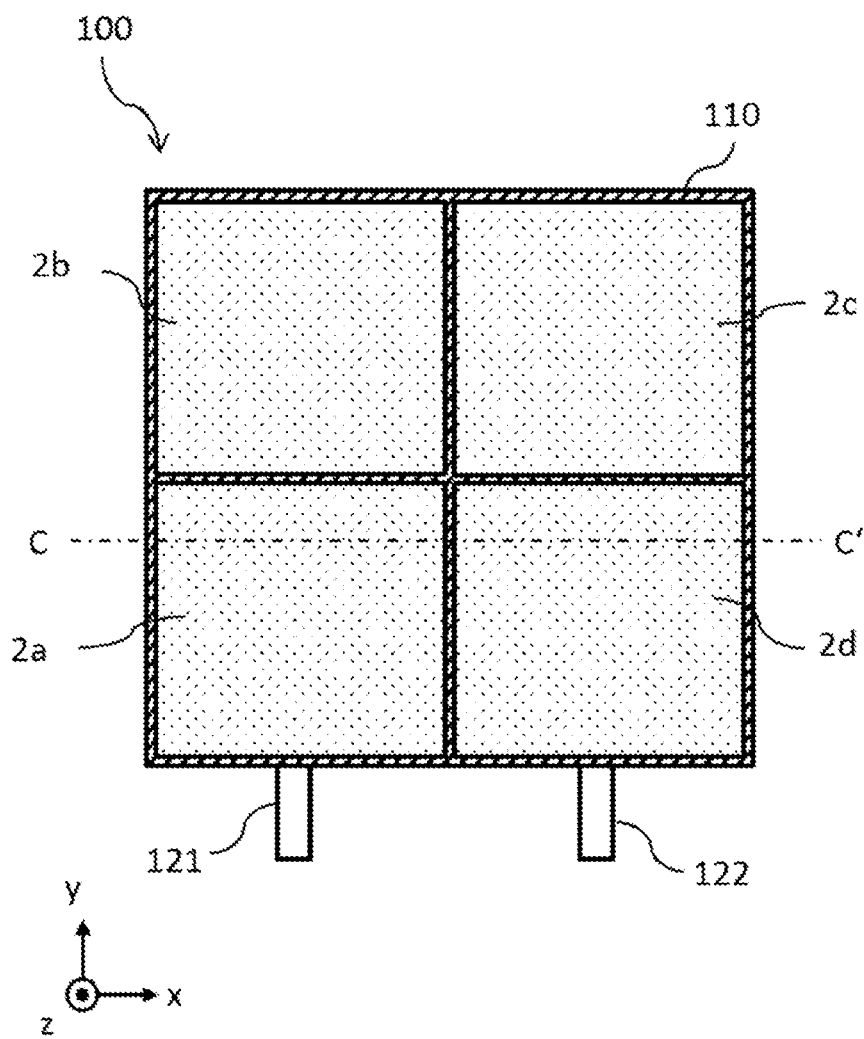
Figure 3B:
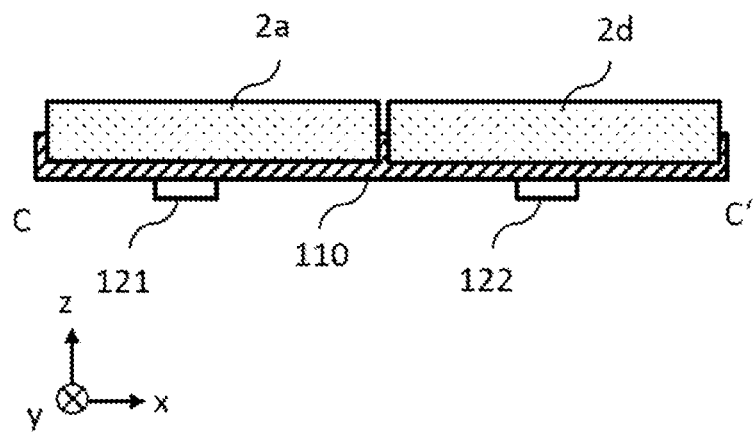
Figure 3C:
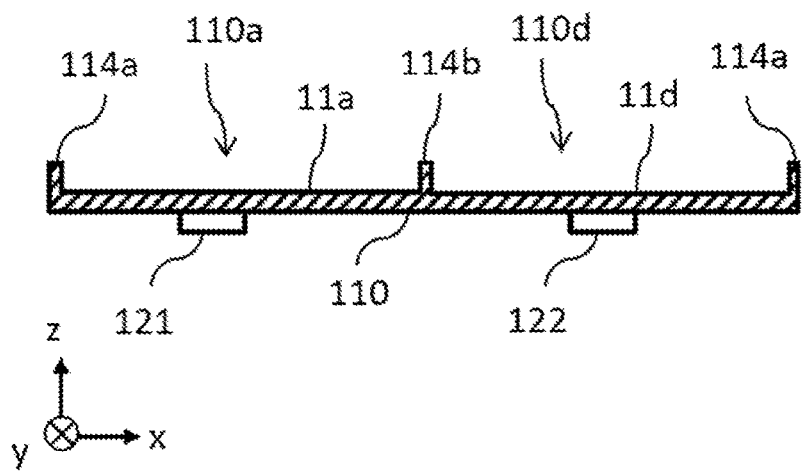
Figure 4A:
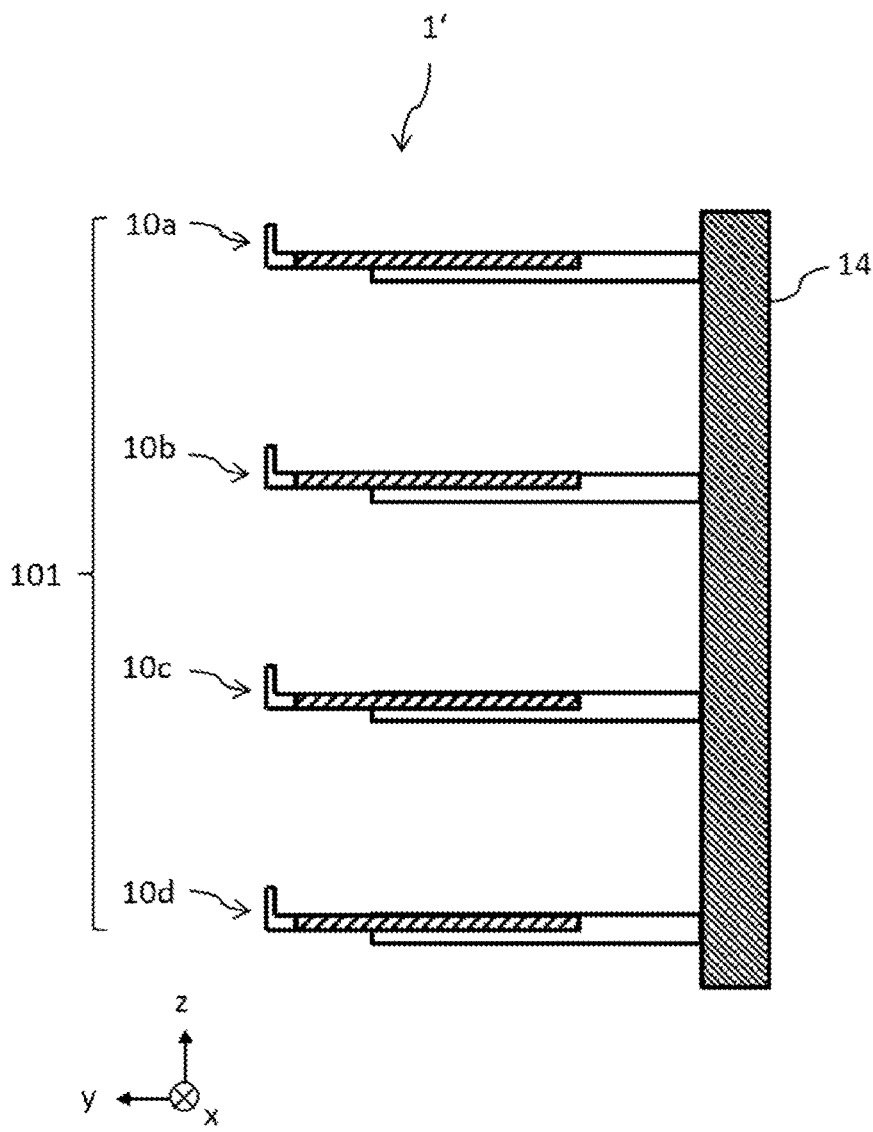
Figure 4B:
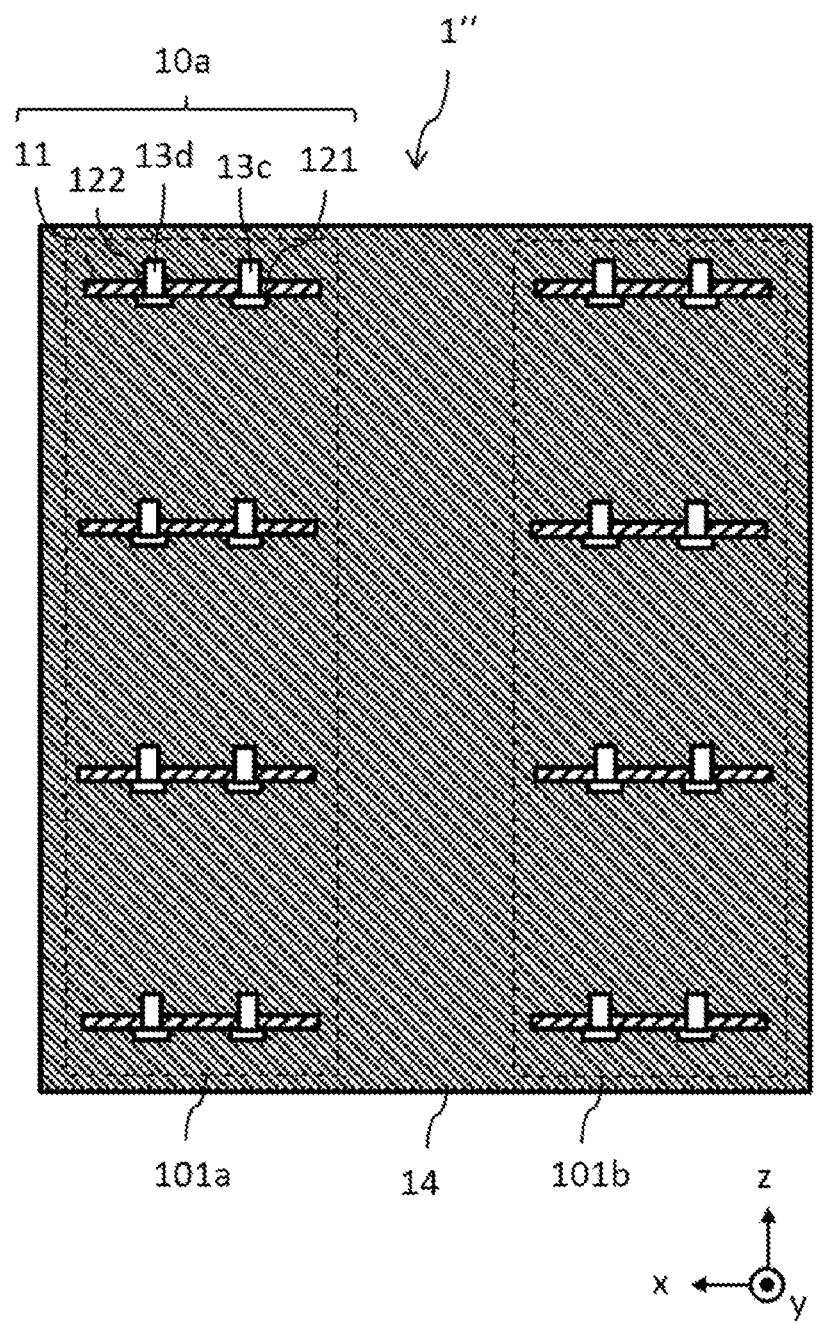
Figure 5A:
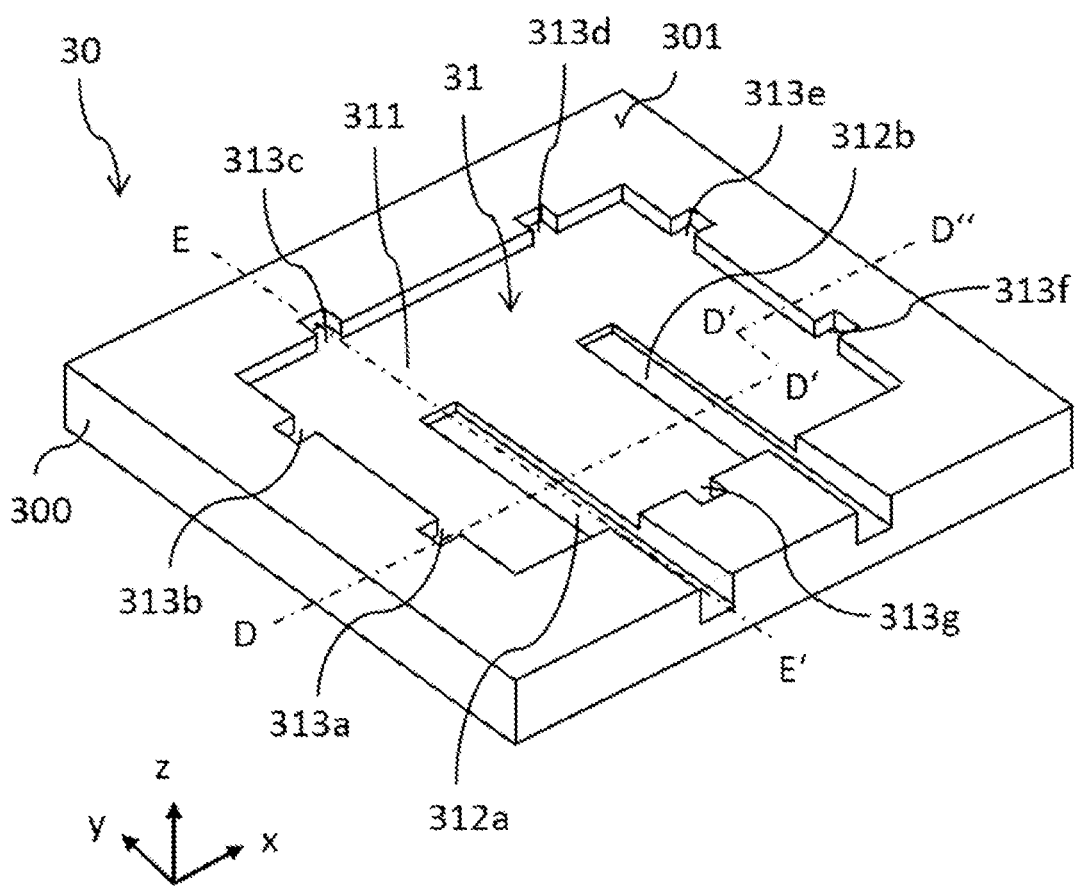
Figure 5B:
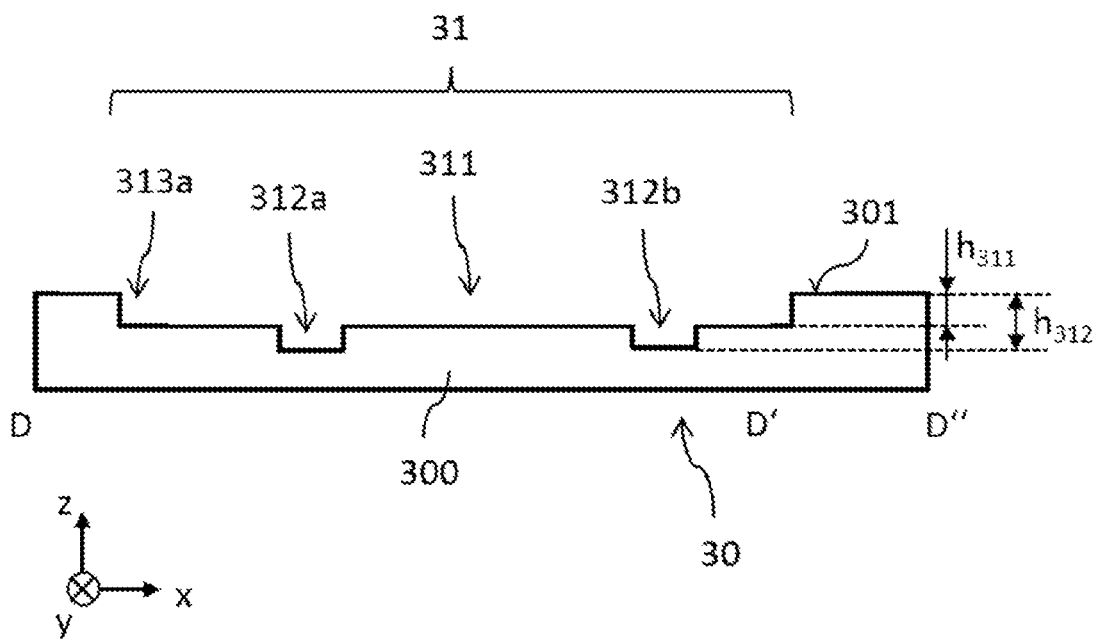
Figure 5C:
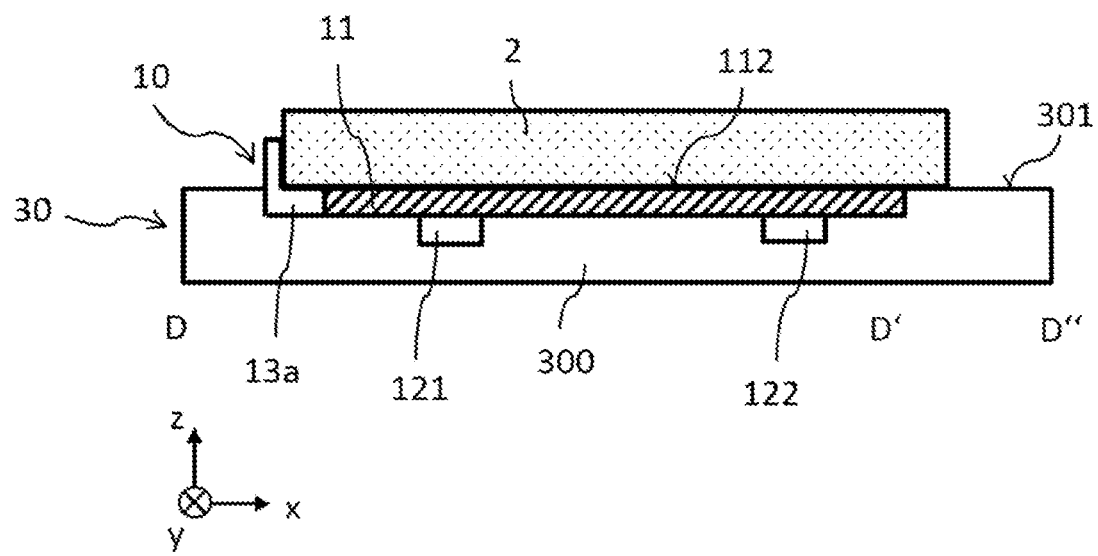
Figure 5D:
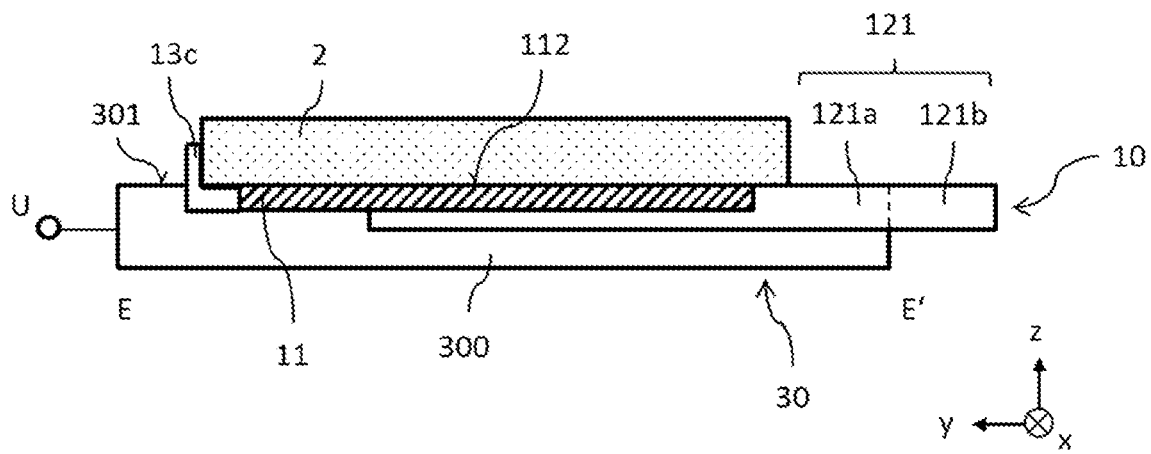
Figure 6:
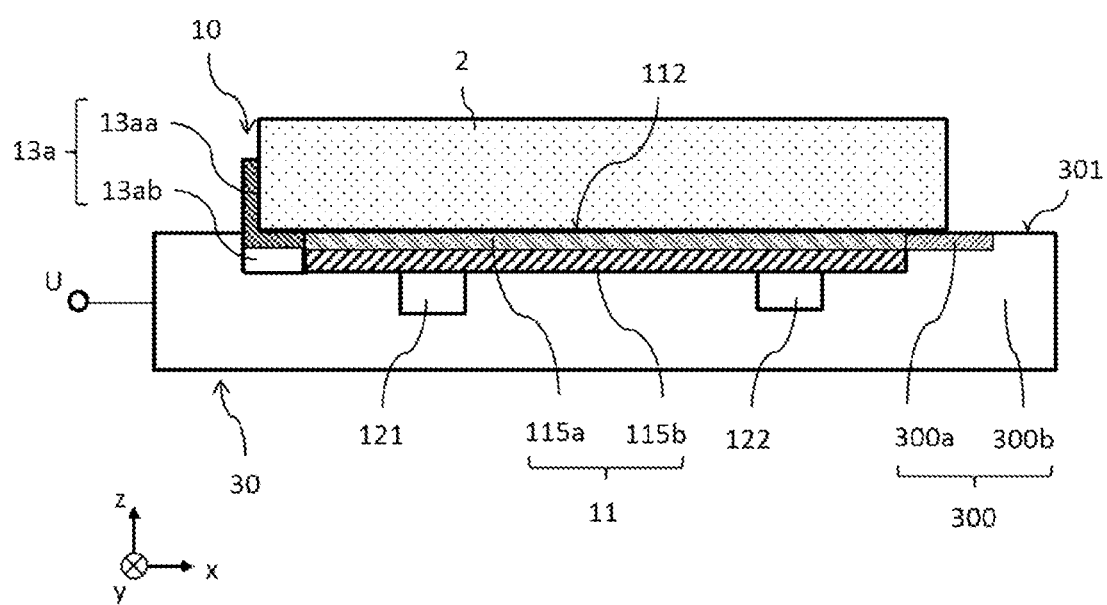
Figure 7A:
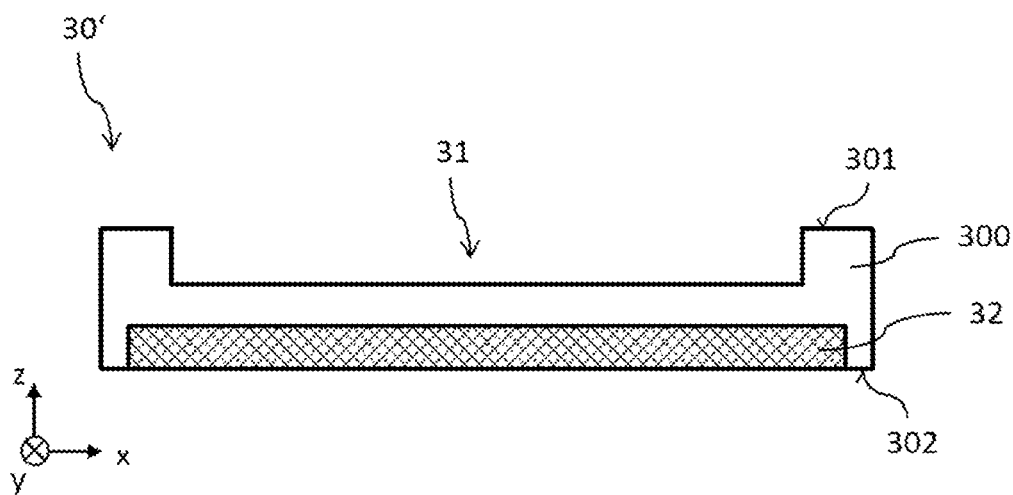
Figure 7B:
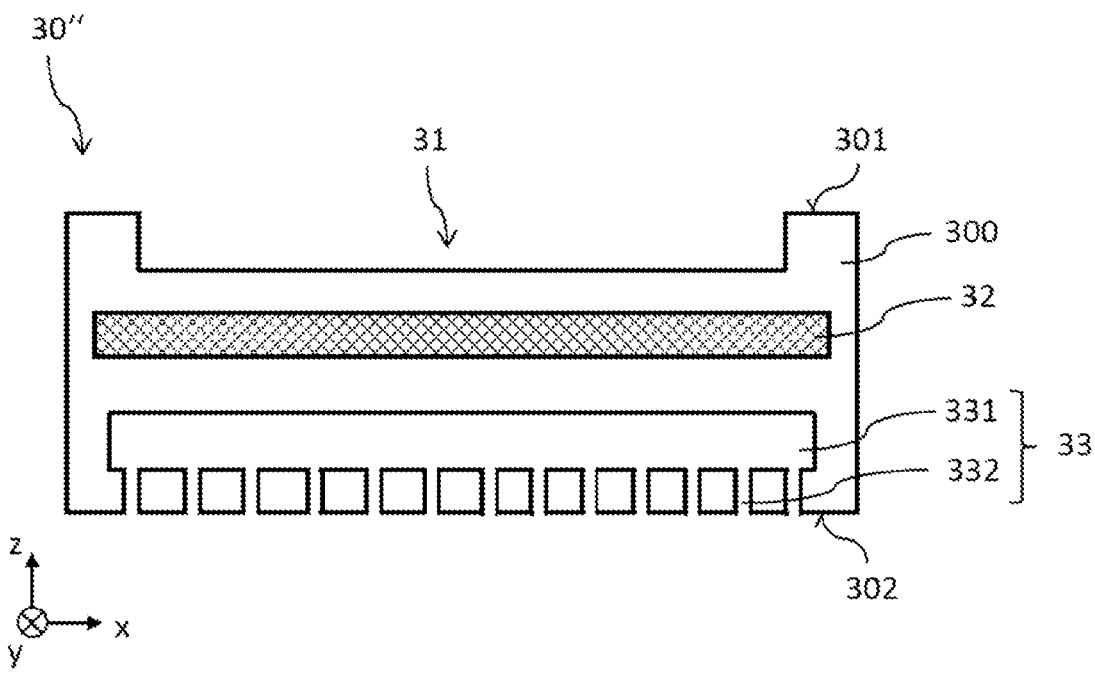
Figure 8A:
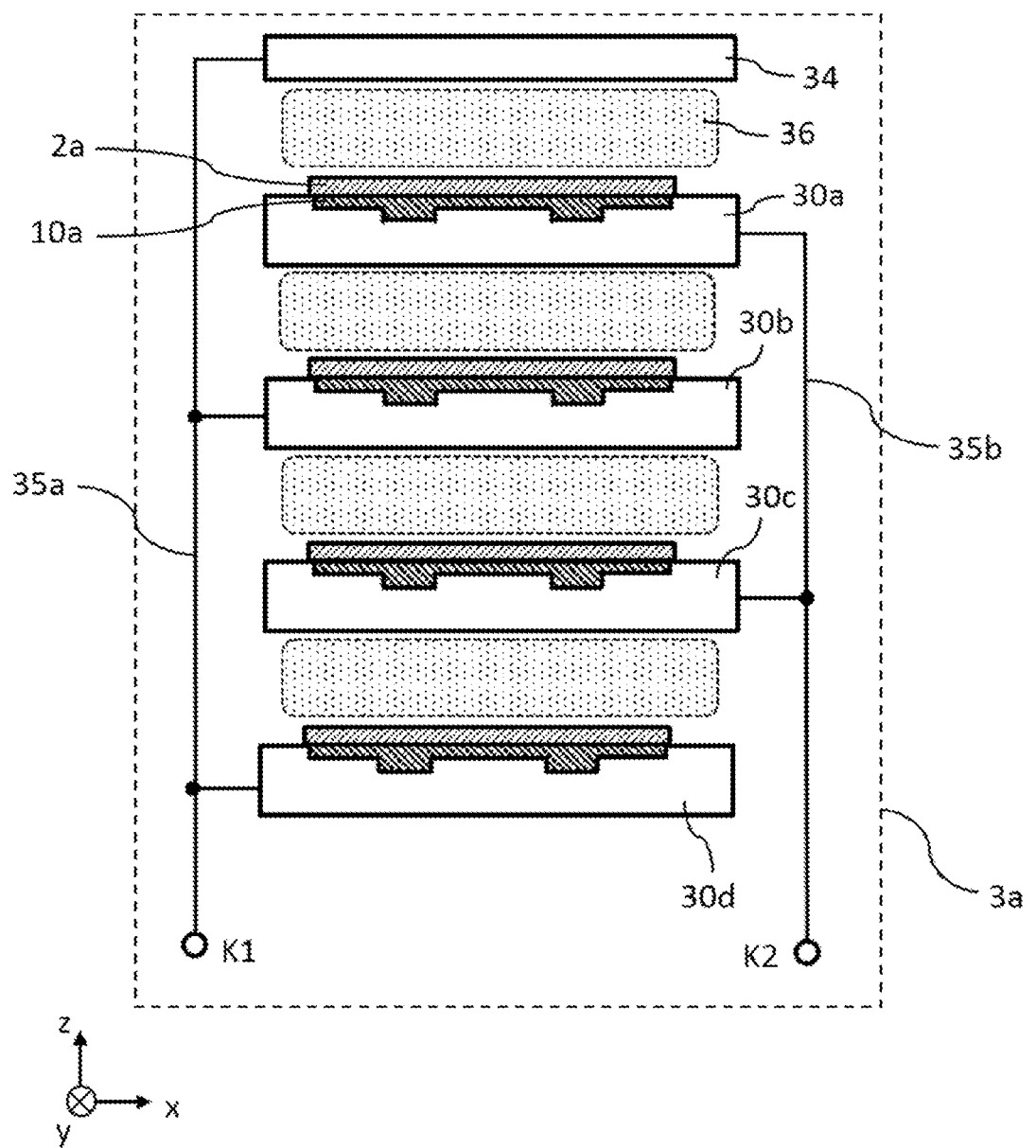
Figure 8B:
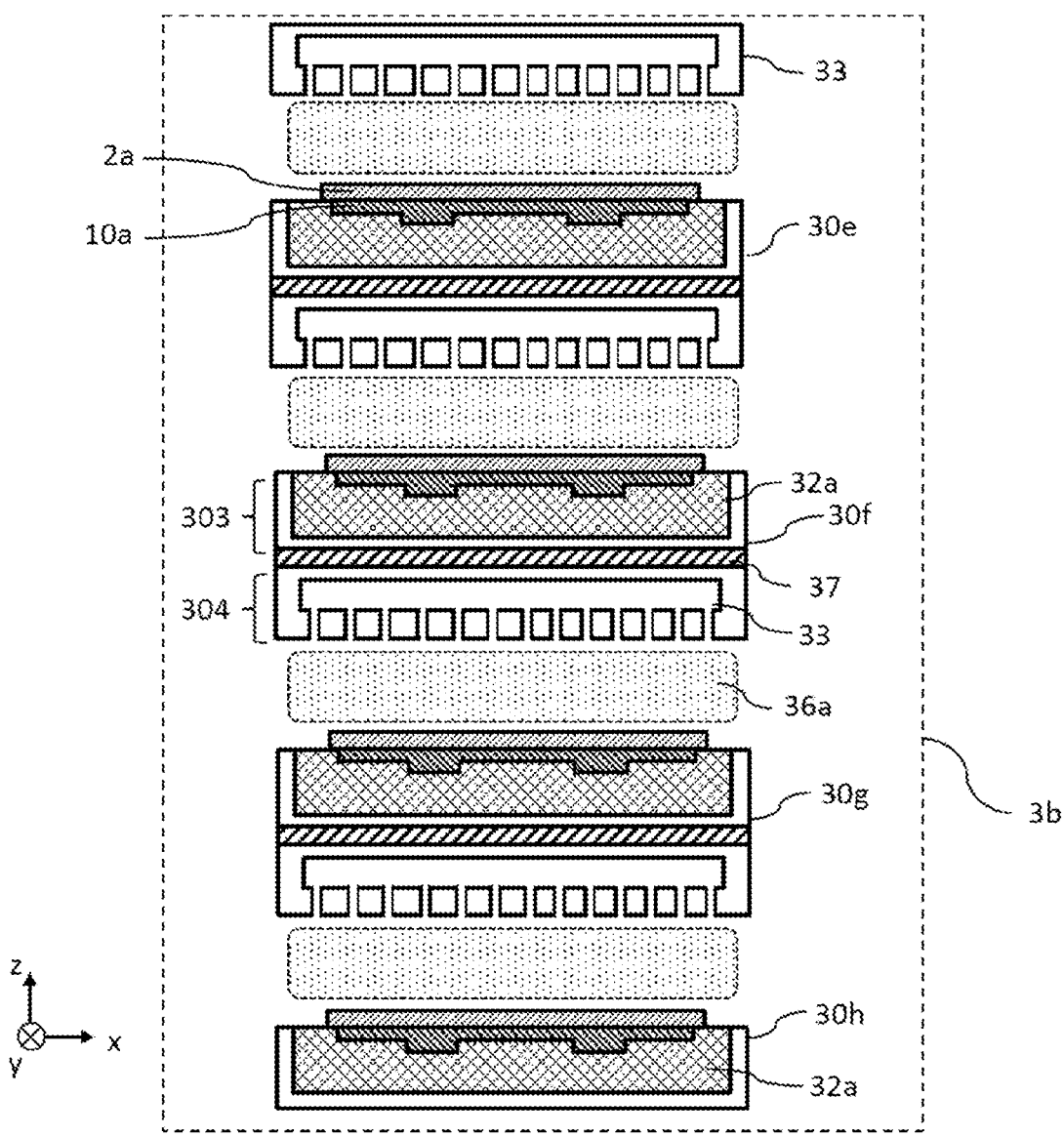
Figure 9:
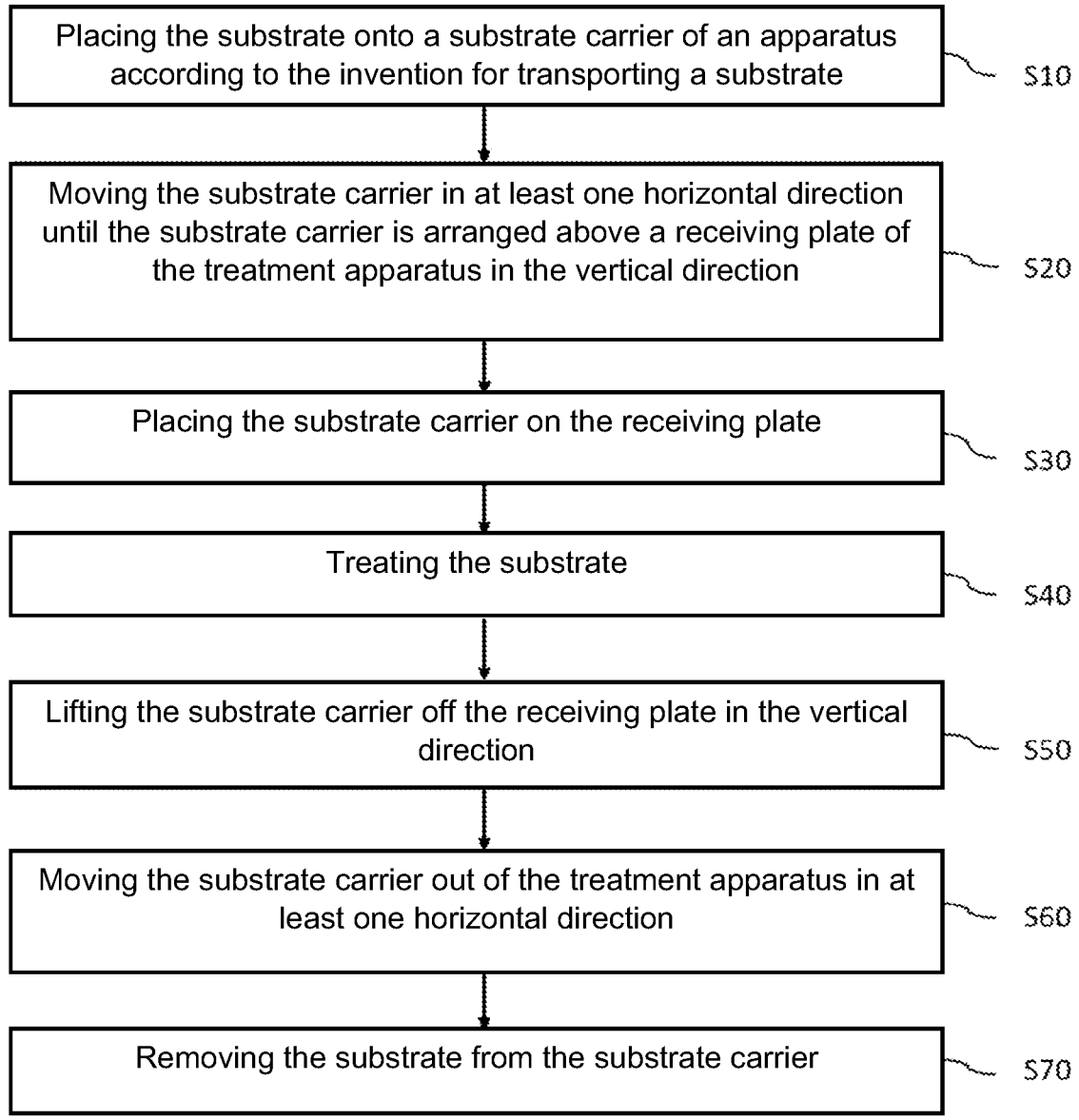
Figure 10A:
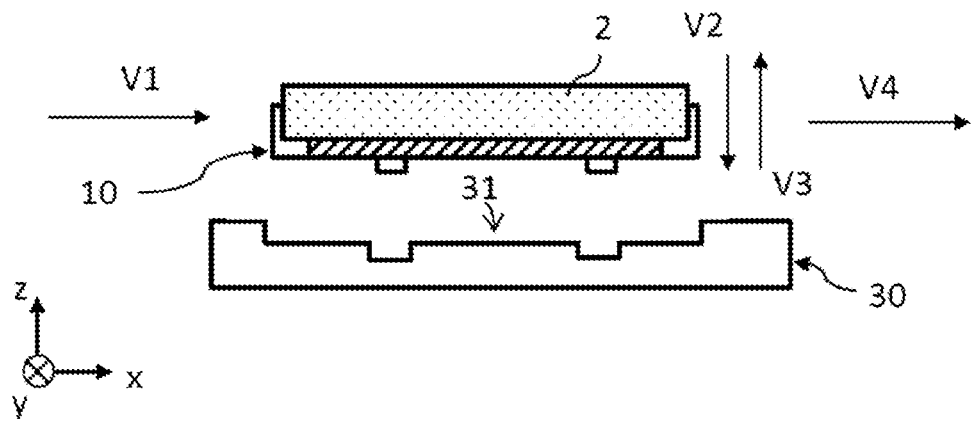
Figure 10B:
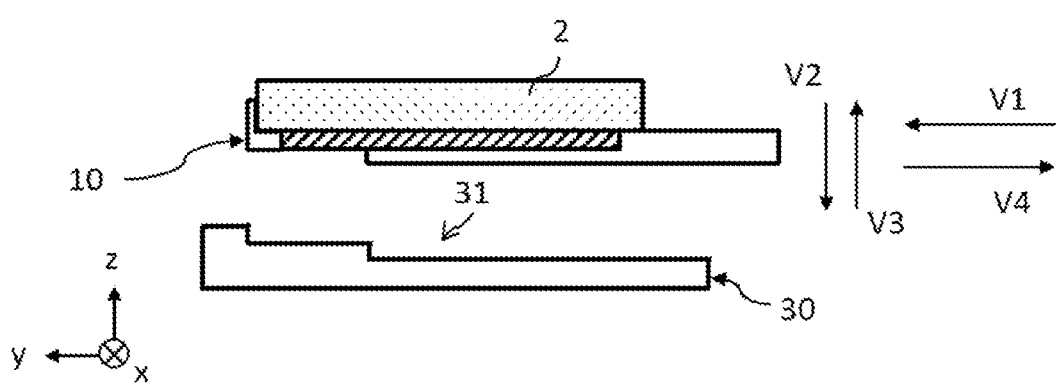
Figure 10C:
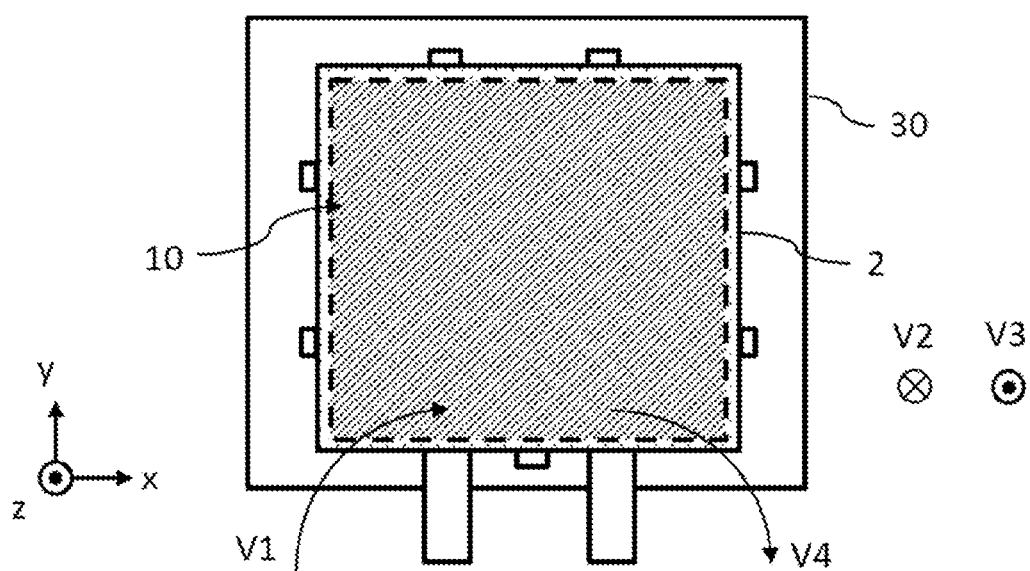
Figure 11:
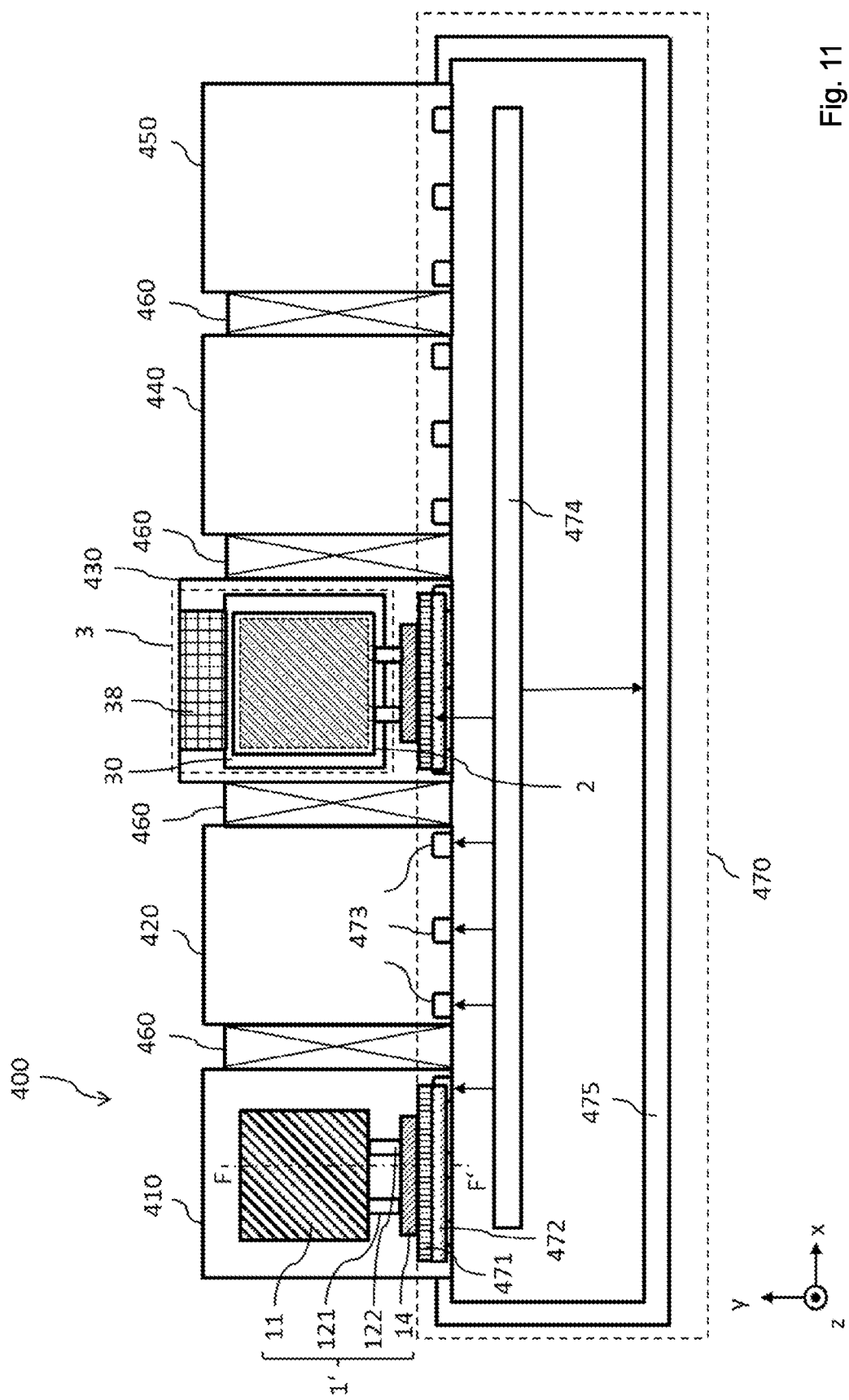
Figure 12A:
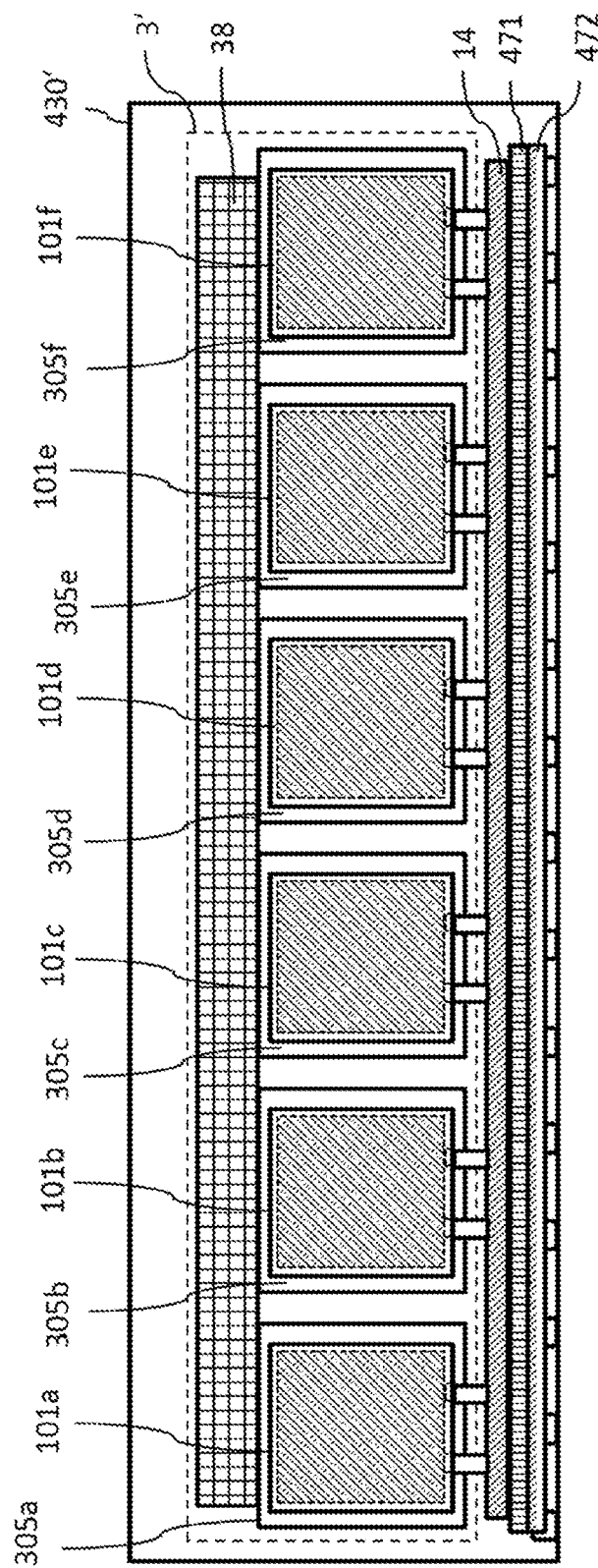
Figure 12B:
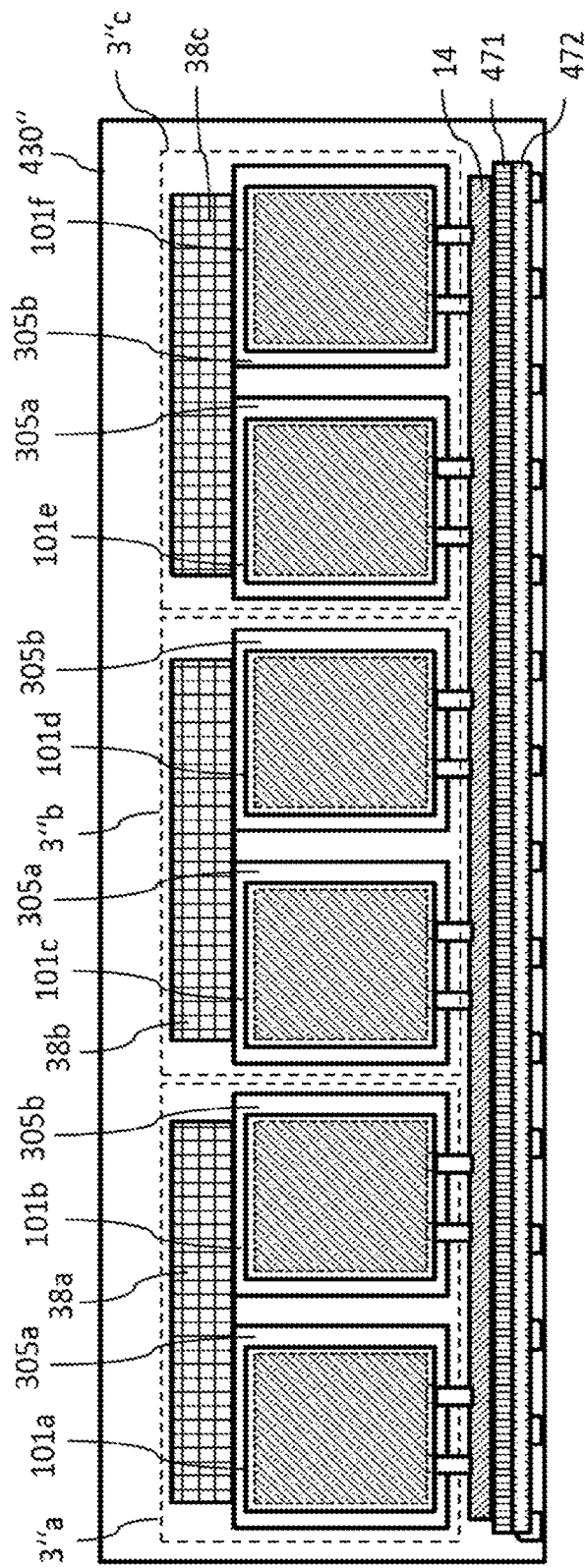
Figure 13:
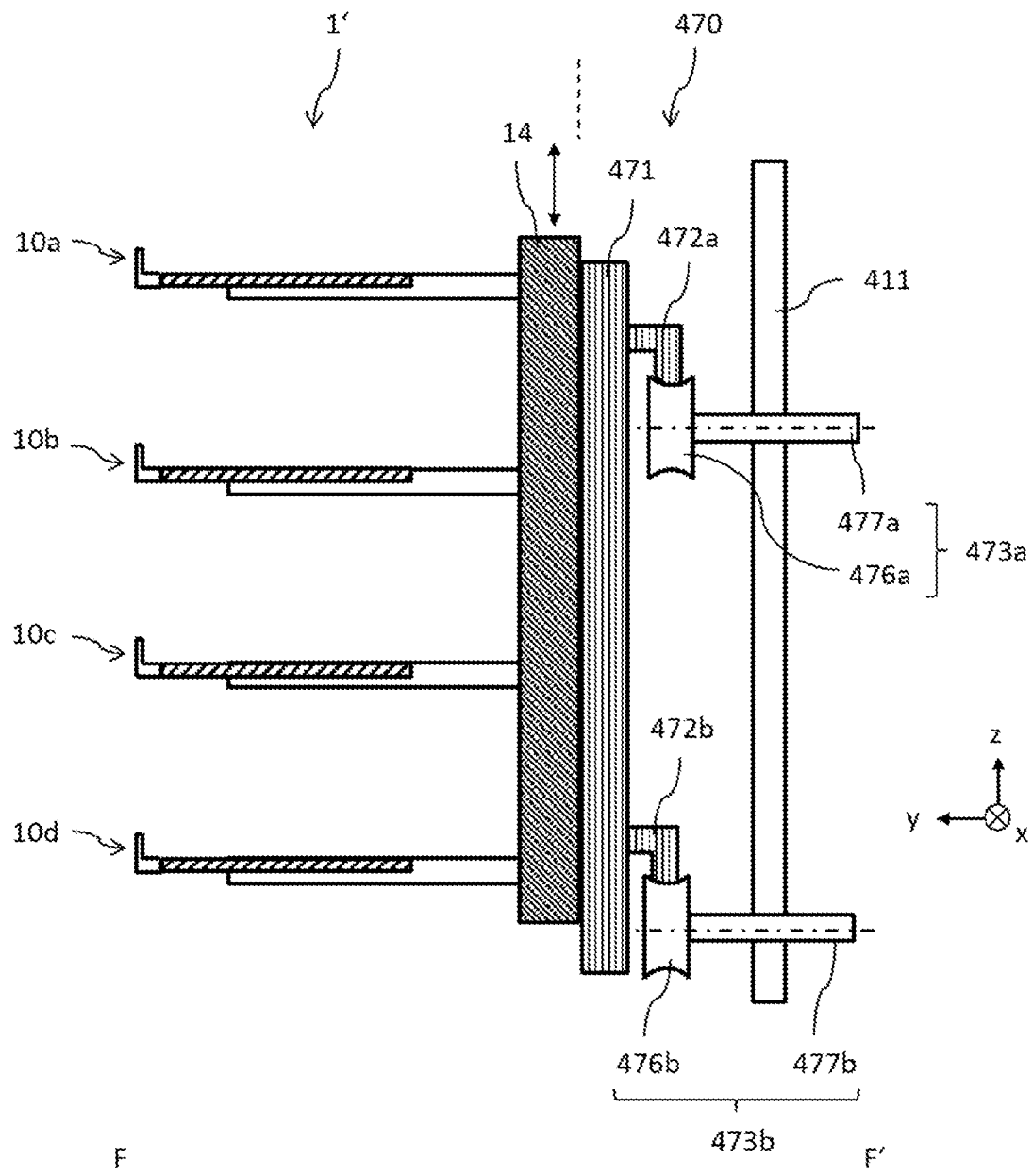

The invention will be explained in more detail below with reference to the drawings. In this case, the dimensions of the individual elements and their relation to each other are not to scale but are reproduced only schematically. The same reference signs denote the same components. In the drawings:

FIG. 1A is a schematic plan view of a first embodiment of the apparatus according to the invention for transporting a substrate having a first embodiment of the substrate carrier, FIG. 1B is a schematic cross section through the first embodiment along the line A-A' of FIG. 1A, FIG. 10 is a schematic plan view of the substrate carrier of FIG. 1A with a substrate resting thereon, FIG. 1D is a schematic cross section through the substrate carrier of FIG. 10 with a substrate resting thereon along the line B-B' from FIG. 10, FIG. 2A is a schematic plan view of a second embodiment of the substrate carrier, FIG. 2B is a schematic plan view of a third embodiment of the substrate carrier, FIG. 3A is a schematic plan view of a fourth embodiment of the substrate carrier with substrates resting thereon, FIG. 3B is a schematic cross section through the fourth embodiment along the line C-C' of FIG. 3A, FIG. 3C is the cross section from FIG. 3B without the substrates resting on top, FIG. 4A is a side view of a second embodiment of the apparatus for transporting a substrate that has a unit of a plurality of superposed substrate carriers, FIG. 4B is a front view of a third embodiment of the apparatus for transporting a substrate that has two units of a plurality of superposed substrate carriers, wherein said units are arranged next to each other, FIG. 5A is a perspective view of a first embodiment of the receiving plate of a treatment apparatus according to the invention, FIG. 5B is a schematic cross section through the first embodiment of the receiving plate along the line D-D'-D" of FIG. 5A, FIG. 5C is a schematic cross section through the first embodiment of the receiving plate along the line D-D'-D" of FIG. 5A with the substrate carrier and the substrate resting thereon, FIG. 5D is a schematic cross section through the first embodiment of the receiving plate along the line E-E' of FIG. 5A with the substrate carrier and the substrate resting thereon, FIG. 6 is a schematic cross section through an embodiment of the receiving plate of a treatment apparatus according to the invention and an embodiment of the substrate carrier according to the invention in which a capacitive coupling is realised between the receiving plate or the substrate carrier and the substrate, FIG. 7A is a schematic cross section through a second embodiment of the receiving plate of a treatment apparatus according to the invention, the recess in the receiving plate being shown only in a simplified form, FIG. 7B is a schematic cross section through a third embodiment of the receiving plate of a treatment apparatus according to the invention, the recess in the receiving plate being shown only in a simplified form, FIG. 8A is a schematic representation of a treatment apparatus according to the invention having a plurality of receiving plates designed as plasma electrodes, FIG. 8B is a schematic representation of a treatment apparatus according to the invention having a plurality of receiving plates that are designed as a combination of a gas distributor and a substrate heater for CVD applications, FIG. 9 is a schematic representation of an embodiment of the method according to the invention for processing a substrate in a treatment system using an apparatus according to the invention for transporting a substrate, FIG. 10A is a schematic representation of a first embodiment of the sequence of movements according to the method according to the invention for processing a substrate, FIG. 10B is a schematic representation of a second embodiment of the sequence of movements according to the method according to the invention for processing a substrate, FIG. 100 is a schematic representation of a third embodiment of the sequence of movements according to the method according to the invention for processing a substrate, FIG. 11 is a schematic plan view of an embodiment of the treatment system according to the invention, FIG. 12A is a schematic plan view of a treatment chamber having a treatment apparatus and an apparatus for transporting a substrate having a plurality of units of substrate carriers, FIG. 12B is a schematic plan view of a treatment chamber having three treatment apparatuses and an apparatus for transporting a substrate having a plurality of units of substrate carriers, and FIG. 13 is a schematic cross section through an apparatus according to the invention for transporting a substrate and a movement arrangement for moving the apparatus according to the invention for transporting a substrate along the line F-F' from FIG. 11.

FIG. 1A is a schematic plan view of an apparatus 1 according to the invention for transporting a substrate in a first embodiment having a substrate carrier 10 in a first embodiment. The apparatus 1 for transporting a substrate comprises the substrate carrier 10 and a carrier arrangement 14. The substrate carrier 10 includes a holding area 11, two gripping arms 121 and 122 and seven holding devices 13a to 13g.

The holding area 11 extends in a horizontal plane that is defined by a first horizontal direction along the x-axis and a second horizontal direction along the y-axis, the first and the second horizontal direction being perpendicular to each other. The holding area 11 has a quadrangular shape and is designed as a closed body, i.e. without recesses, holes or protruding parts. Any materials that meet the necessary requirements for carrying a substrate resting on the holding area 11 and, if appropriate, for electrically and thermally contacting the substrate and the process conditions of a treatment of the substrate can be used as a material for the holding area 11. For example, the holding area 11 consists of aluminium, graphite, copper, silicon or silicon carbide or layer sequences of a plurality of these substances. If the holding area 11 reaches a temperature greater than or equal to 400° C. in the course of a treatment process, the holding area 11 consists of one or a plurality of correspondingly temperature-stable materials, such as ceramic or quartz glass, or of sequences of layers thereof and other materials. The holding area 11 is preferably entirely formed from only one material.

The gripping arms 121 and 122 are connected to the holding area 11 and preferably consist of the same material as the holding area 11 but can also have different regions containing different materials. This is shown by way of example for the gripping arm 121. Said gripping arm has a first region 121a that adjoins the holding area 11 and consists of the same material as the holding area 11 and a second region 121b that, at one of its ends, adjoins the first region 121a and, at its other end, adjoins the carrier arrangement 14. The second region 121b consists of a different material than the first region 121a. For example, the first region 121a is made from an electrically conductive material such as aluminium while the second region 121b is made from an electrically insulating material such as ceramic. Thus, the second region 121b electrically insulates the first region 121a and the holding area 11 from the carrier arrangement 14. In the plan view, the gripping arms 121, 122 protrude beyond the holding area 11, thus making possible the connection of the holding area 11 to the carrier arrangement 14, which can be connected to a manipulator to move the substrate carrier 10. The gripping arms 121, 122 are preferably identical in design. Of course, the necessary temperature stability is also to be factored into the selection of the material of the individual regions of the gripping arms 121, 122, as described with reference to the holding area 11.

The holding devices 13a to 13g serve to secure a substrate resting on the holding area 11 against lateral displacement, for example slipping or twisting, on the holding area 11 while the substrate carrier 10 is moving. Said holding devices preferably consist at least in part of the same material as the holding area 11 and are connected to the holding area 11. In this case, said holding devices extend from an edge 111 of the holding area in a horizontal direction, i.e. in the same plane as the holding area 11, and in the vertical direction, which can be seen in FIG. 1B. All the holding devices 13a to 13g are preferably identical in design.

The gripping arms 121, 122 and/or the holding devices 13a to 13g can be connected to the holding area 11 by means of a detachable or non-detachable, material-locking or force-locking connection. Said gripping arms and/or the holding devices can be glued or welded, for example. However, the gripping arms 121, 122 and/or the holding devices 13a to 13g can also be integrally formed with the holding area 11, for example by means of milling or etching from a common starting material block.

FIG. 1B is a schematic cross section through the apparatus 1 from FIG. 1A along the line A-A', i.e. through the holding device 13c, the holding area 11, the gripping arm 121 and the carrier arrangement 14. The holding area 11 has a first surface 112 on which a substrate to be treated can rest and a second surface 113 that is opposite the first surface 112. The first surface 112 and the second surface 113 each extend in a horizontal plane, said horizontal planes being parallel to each other. The holding device 13c first extends from the vertically extending edge 111 in the second horizontal direction (y-axis) away from the holding area 11 and then in the vertical direction, i.e. along the z-axis, such that an upper surface of the holding device 13c is in a plane that is higher than the plane of the first surface 112. The gripping arm 121 is in part arranged on the second surface 113 of the holding area 11, i.e. on the rear side of the holding area 11, where it is connected to the holding area 11. Said gripping arm extends beyond the holding area 11 and thus projects beyond the holding area 11 in the second horizontal direction (y-axis). The gripping arm 121 advantageously also encloses the edge 111 of the holding area 11 in the lateral regions in which it projects beyond the holding area 11. Furthermore, the upper surface of the gripping arm 121 is in the same horizontal plane as the first surface 112 of the holding area 11 in the regions in which said gripping arm projects beyond the holding area 11. As already mentioned with reference to FIG. 1A, the gripping arm 121 comprises a first region 121a and a second region 121b. The first region 121a comprises at least all the regions of the gripping arm that are in contact with the holding area 11 and preferably also extends in the horizontal direction, i.e. along the y-axis, to some distance from the edge 111 of the holding area 11. This distance, which describes the boundary between the first and the second region 121a, 121b, preferably corresponds precisely to the distance between an edge region of a recess in a receiving plate of a treatment apparatus in which a substrate resting on the holding area 11 is treated, the holding area 11 of the substrate carrier 10 being inserted into the recess, and the outer edge of the receiving plate. This will be explained in more detail later with reference to FIG. 5A to 5D and the treatment apparatus according to the invention.

The configuration of the substrate carrier 10 with respect to a substrate 2 resting thereon will be explained in greater detail with reference to FIGS. 10 and 1D. FIG. 10 is a schematic plan view of the substrate carrier 10 of FIG. 1A with the substrate 2 resting thereon. As can be seen, the substrate 2 has a rectangular shape that corresponds to the shape of the holding area 11, the holding area 11 being minimally smaller than the substrate 2 in its lateral extent, i.e. in its area size. The substrate 2 has a length $L_1$ along the second horizontal direction (y-axis) while the holding area 11 has a length $L_{11}$ along the second horizontal direction, which length is minimally smaller than the length $L_1$. In principle, the length $L_{11}$ can also be equal to or minimally larger than the length $L_1$. The gripping arms 121, 122 have a width $b_{12}$ along the first horizontal direction (x-axis) and an entire length $L_{12}$ along the second horizontal direction (y-axis). The width $b_{12}$ is the same over the entire length of the gripping arm 121, 122 but can also vary over the length of the gripping arm in other embodiments. The first region 121a has a length Lila projecting beyond the holding area 11, which length corresponds to a length of an edge region of a receiving plate as will be described later with reference to the treatment apparatus according to the invention. The second region 121b has a length $L_{12b}$. The holding devices 13a to 13g, of which only the holding devices 13a, 13e and 13f are designated in FIG. 10, have a length $L_{13}$ that is substantially smaller than the length $L_1$ of the substrate 2. For each holding device 13a to 13g, the length $L_{13}$ is measured along the edge of the substrate 2 to which the respective holding device 13a to 13g is adjacent. That is, the length $L_{13}$ of a holding device 13a to 13g is not always defined as the extent of the respective holding device along the second horizontal direction (y-axis), as shown for the holding device 13e in FIG. 10, but is defined as the extent of the holding device along the first horizontal direction (x-axis) when the corresponding holding device holds an edge of the substrate 2 that extends along the first horizontal direction.

FIG. 1D is a schematic cross section through the substrate carrier 10 of FIG. 10 with the substrate 2 resting thereon along the line B-B' of FIG. 10. The substrate 2 has a width $b_1$ along the first horizontal direction (x-axis) while the holding area 11 has a width $b_{11}$ along the first horizontal direction, which width is minimally smaller than the width $b_1$. In principle, the width $b_{11}$ can also be equal to or minimally larger than the width $b_1$. The substrate 2 has a first surface 201, which is the substrate surface to be processed, and a second surface 202 opposite the first surface 201, as well as an edge 203 that connects the first surface 201 and the second surface 202 vertically (along the z-axis). The substrate 2 rests on the first surface 112 of the holding area 11 with at least part of its second surface 202. The edge 203 of the substrate 2 has a height $h_1$ along the vertical direction (z-axis), it being possible for other regions of the substrate 2 to have other heights. The holding area 11 has a height $h_1$ that is preferably the same over the entire lateral extent of the holding area 11. In the region in which they contact the second surface 113 of the holding area 11, the gripping arms 121, 122 have a height $h_{12'}$ and, in other regions, a height $h_{12}$ that corresponds to the sum of the height $h_{12'}$ and the height $h_{11}$ of the holding area 11. The height $h_{12'}$ and the height $h_{12}$ are the same over the entire extent of the corresponding regions of the gripping arm 121, 122 but can also vary within the corresponding region in other embodiments. The holding devices 13a to 13g, of which only the holding devices 13a and 13f can be seen in FIG. 1D, have a height $h_{13}$ measured from the first surface 112 of the holding area 11 that is greater than zero and preferably less than the height $h_1$ of the substrate 2. As shown in the first embodiment of FIG. 1A to 1D, the holding devices 13a to 13g can extend from the edge 111 of the holding area 11 such that their underside is, in each case, level with the second surface 113 of the holding area 11. However, the holding devices 13a to 13g can also adjoin the second surface 113 of the holding area 11 as described for the gripping arms 121, 122 or extend upwards in the vertical direction from the first surface 112 of the holding area 11 if the length $L_{11}$ and width $b_{11}$ of the holding area 11 are greater than the length $L_1$ and the width $b_1$ of the substrate 2. The holding devices 13a to 13g have a width $b_{13}$ that is substantially smaller than the width $b_1$ of the substrate 2. In this case, the width $b_{13}$ is measured for each holding device 13a to 13g along a direction that extends orthogonally relative to the edge of the substrate 2 to which the respective holding device 13a to 13g is adjacent. That is, the width $b_{13}$ of a holding device 13a to 13g is not always defined as the extent of the respective holding device along the first horizontal direction (x-axis), as shown for the holding device 13f in FIG. 1D, but is defined as the extent of the holding device along the second horizontal direction (y-axis) when the corresponding holding device holds an edge of the substrate 2 that extends along the first horizontal direction. The width $b_{13}$, the height $h_{13}$ and the length $L_{13}$ of the holding device 13a to 13g determine a surface of the holding device 13a to 13g that is likewise subjected to treatment during treatment of the substrate 2 in a treatment apparatus, in particular subjected to an ambient atmosphere in the treatment apparatus, and can thus likewise be coated, doped or otherwise contaminated. Therefore, these dimensions are preferably as small as is absolutely necessary to fulfil their holding function so that the contaminated surface is kept as small as possible.

The dimensions of the holding area 11, the gripping arms 121, 122 and the holding devices 13a to 13g are dimensioned in such a way that secure handling of the substrate carrier 10 and the substrate 2 is ensured as a whole. The dimensions of the gripping arms 121, 122 and the regions thereof as well as the dimensions of the holding devices 13a to 13g are preferably the same for all the gripping arms and holding devices, respectively, but can also be different for some or each gripping arm and some or all the holding devices, respectively.

Exemplary dimensions for the components of the substrate carrier 10 and a substrate 2 are given in Table 1 below.

TABLE 1

| Element | Length | Width | Height |
|---|---|---|---|
| Substrate 2 | $L_1$ = 156 mm | $b_1$ = 156 mm | $h_1$ = 0.2 mm |
| Holding area 11 | $L_{11}$ = 150 mm | $b_{11}$ = 150 mm | $h_{11}$ = 1 mm |
| Gripping arm 121, 122 | $L_{12}$ = 70 mm | $b_{12}$ = 10 mm | $h_{12}$ = 3 mm |
|  | $L_{12a}$ = 20 mm |  | $h_{12'}$ = 2 mm |
|  | $L_{12b}$ = 20 mm |  |  |
| Holding device 13a to 13g | $L_{13}$ = 10 mm | $b_{13}$ = 1 mm | $h_{13}$ = 0.5 mm |

FIGS. 2A and 2B are schematic plan views of a second and a third embodiment, respectively, of the substrate carrier 10' and 10", respectively, in which the shape of the holding area 11' and 11", respectively, is different from the shape of the holding area 11 of the first embodiment of the substrate carrier 10 from FIG. 1A to 1D. Thus, the holding area 11' of the substrate carrier 10' has a circular shape that is optimised for transporting a round substrate, whereas the holding area 11" of the substrate carrier 10" has a regular hexagonal shape that is optimised for a substrate having a corresponding shape. However, any other shapes of the holding area, such as oval, triangular, octagonal or irregular shapes, are also possible, each being adapted to the shape of the substrate. Depending on the size and shape of a substrate, the number, dimensions and arrangement of the gripping arms can be adjusted. By way of example, FIG. 2A shows one gripping arm 121 and FIG. 2B shows two gripping arms 121, 122. The number, shape and dimensions of the holding devices are adapted to the respective shape of the holding area such that lateral displacement, for example slipping or twisting, of a substrate on the holding area in any horizontal direction is avoided. By way of example, FIG. 2A shows three holding devices 13a to 13c, and FIG. 2B shows five holding devices 13a to 13e.

While the previously described embodiments of the substrate carrier are only suitable for holding and transporting one substrate, the substrate carrier can also have a plurality of holding areas and thus be suitable for simultaneously holding and transporting a plurality of substrates. This will be described with reference to FIG. 3A to 3C and a fourth embodiment of the substrate carrier. FIG. 3A is a schematic plan view of a substrate carrier 100 with substrates 2a to 2d resting thereon, while FIG. 3B is a schematic cross section through the substrate carrier 100 along the line C-C' of FIG. 3A. The substrates 2a to 2d are arranged next to each other in a horizontal plane in a configuration of two columns and two rows, any lateral configuration of substrates—optimised for the shape of the substrates—being possible, i.e. for example, a configuration of the substrates in a staggered shape, in a honeycomb shape or in a circular shape. Each holding area has a shape and size corresponding to the shape of the substrate held thereon, the holding areas being designed as recesses in a base body 110 of the substrate carrier 100. In this case, the lateral dimensions of the holding areas are dimensioned in such a way that the respective substrate rests with its rear side completely on the holding area. The individual substrates 2a to 2d are spaced apart from adjacent substrates 2a to 2d and from one edge of the base body 100 by vertically extending regions of the base body 110. The substrate carrier 100 has two gripping arms 121, 122 that are arranged as described with respect to the substrate carrier 10 of the first embodiment, the number, dimensions and arrangement of the gripping arms being adapted to the dimensions of the base body 110 and the total weight of the substrate carrier 100 with substrates 2a to 2d resting on top.

FIG. 3C shows the cross section through the substrate carrier 100 shown in FIG. 3B without the substrates resting thereon. Recesses 110a and 110d are formed in the base body 110, the base surface of each of which forms a holding area 11a or 11d for receiving a substrate. The recesses are delimited by lateral regions of the base body 110 that are formed as a side frame 114a on the outer edge of the base body and as a web 114b between the recesses 110a and 110d. The side frame 114a, which extends along the entire edge of the base body 110, and the web 114b serve as holding devices for laterally securing the respective substrate on a corresponding holding area 11a or 11d. Preferably, the side frame and the webs formed between various holding areas are designed to be continuous, i.e. designed without interruptions. However, it is also possible for the side frame and the webs to be formed only as isolated structures laterally spaced apart from each other that extend upwards from the base body 110 of the substrate carrier in the vertical direction (z-axis). The height of the side frame 114a and the webs 114b is preferably less than the height of the substrates, the heights each being measured in the vertical direction from the holding area 11a, 11d. All the holding areas 11a, 11d, all the webs 114b and all the regions of the side frame 114a are preferably identical in design.

Further embodiments of the apparatus according to the invention for transporting a substrate are explained with reference to FIGS. 4A and 4B. In this case, FIG. 4A is a side view of an apparatus 1' according to the invention for transporting a substrate in a second embodiment that is likewise suitable for simultaneously holding and transporting a plurality of substrates. In this case, the apparatus 1' has a unit 101 of a plurality of superposed substrate carriers 10a to 10d, it being possible to design each substrate carrier 10a to 10d according to one of the embodiments described with reference to FIG. 1A to 3C. Preferably, all the substrate carriers 10a to 10d are identical in design and arranged congruently one above the other in the vertical direction (along the z-axis), each substrate carrier 10a to 10d having the same distance in the vertical direction from an adjacent substrate carrier 10a to 10d. All the substrate carriers 10a to 10d are fastened to the same carrier arrangement 14 that realises the common holding and movement of the substrate carriers 10a to 10d.

If a temperature greater than or equal to 400° C. is reached in the course of a treatment process, as is the case, for example, in an MOCVD process, then the carrier arrangement 14 consists of one or a plurality of correspondingly temperature-stable materials, such as ceramic or quartz glass, or of sequences of layers thereof and other materials. Alternatively or additionally, an arrangement for thermal insulation can also be arranged on the surface of the carrier arrangement 14 facing the holding areas of the substrate carriers 10a to 10d or between the holding areas of the substrate carriers 10a and 10d and the carrier arrangement 14. Such an arrangement for thermal insulation can, for example, include one or a plurality of heat shields or a corresponding coating of gold or other heat-reflecting layers or else include active cooling by means of cooling fluids.

FIG. 4B is a front view of an apparatus 1" according to the invention for transporting a substrate in a third embodiment. The apparatus 1" includes two units 101a and 101b of superposed substrate carriers as described with reference to FIG. 4A. Each substrate carrier is designed, for example, as a substrate carrier as described with reference to FIG. 1A to 1D and has a holding area 11, one or a plurality of gripping arms 121, 122 as well as holding devices, of which the holding devices 13c and 13d from FIG. 1A can be seen here. This is illustrated by way of example for a substrate carrier 10a. However, other embodiments of the substrate carrier can be designed. The units 101a, 101b are arranged next to each other along the first horizontal direction (x-axis) and are connected to the same carrier arrangement 14. The carrier arrangement 14 is, for example, a quadrangular, preferably rectangular, plate that extends in a plane parallel to the y-z plane and to which the individual substrate carriers are fastened. However, the carrier arrangement 14 can also have any other shape as long as the mechanical stability of all the substrate carriers and the common and simultaneous mobility of all the substrate carriers is ensured. The carrier arrangement can, for example, also be a discontinuous frame structure that has corresponding struts and holders for the substrate carriers. The number of units 101 of vertically stacked substrate carriers arranged next to each other and connected to a carrier arrangement 14 is arbitrary and not limited to the two units 101*a* and 101*b* shown here. For example, up to ten units 101 can be arranged next to each other.

The vertical distances between the individual substrate carriers 10*a* to 10*d* in FIG. 4A correspond in each case to a distance between individual receiving plates of a treatment apparatus, a substrate carrier being positioned on one of the receiving plates during a substrate treatment in each case. The horizontal distance (along the x-axis) between the units 101*a* and 101*b* in FIG. 4B corresponds to the horizontal distance between individual treatment apparatuses that are arranged next to each other, wherein substrates that rest on substrate carriers of the one unit 101*a* are treated in one of the treatment apparatuses at least in part simultaneously with substrates that rest on substrate carriers of the other unit 101*b* and are treated in the other treatment apparatus.

A first embodiment of a receiving plate of a treatment apparatus according to the invention will be explained with reference to FIGS. 5A to 5D. FIG. 5A is a perspective view of the receiving plate 30, FIG. 5B is a schematic cross section through the receiving plate 30 along the line D-D'-D" of FIG. 5A, FIG. 5C is a schematic cross section through the receiving plate 30 along the line D-D'-D" of FIG. 5A, and FIG. 5D is a schematic cross section through the receiving plate 30 along the line E-E' of FIG. 5A, FIGS. 5C and 5D showing a supported substrate carrier 10 and a substrate 2 arranged thereon, respectively.

The receiving plate 30 comprises a base body 300 having a first surface 301 that extends in a horizontal plane (x-y plane). In the first surface 301, a recess 31 is formed in the receiving plate 30, the shape and dimensions of which are suitable for receiving a substrate carrier of the apparatus according to the invention for transporting a substrate. Thus, the embodiment of the receiving plate 30 shown in FIG. 5A to 5D, which is adapted to the embodiment of the substrate carrier 10 shown in FIG. 1A to 1D, has the following subregions of the recess 31: a recess 311 for receiving the holding area of the substrate carrier, recesses 312*a* and 312*b* for receiving the gripping arms of the substrate carrier and recesses 313*a* to 313*g* for receiving the holding devices of the substrate carrier.

As can be seen in FIG. 5B, the recess 311 for receiving the holding area and the recesses 313*a* to 313*g* for receiving the holding devices, of which only the recess 313*a* can be seen in FIG. 5B, extend in the vertical direction from the first surface 301 up to a height $h_{311}$, whereas the recesses 312*a*, 312*b* for receiving the gripping arms extend from the first surface 301 up to a height $h_{312}$. The difference between the height $h_{312}$ and the height $h_{311}$ corresponds to the height $h_{12'}$ of the regions of the gripping arms adjoining the second surface of the holding area, as illustrated in FIG. 1D. In the cross section shown in FIG. 5B, there is no distinction between the recess 313*a* for receiving a holding device and the recess 311 for receiving a holding area because both recesses have the same height $h_{311}$. The total height of the receiving plate 300 is, for example, 10 mm, whereas the height $h_{311}$ is, for example, 1 mm and corresponds to the height $h_{11}$ of the holding area of the substrate carrier, as shown in FIG. 1D. For example, because the substrate resting on top has a height $h_1$ (shown in FIG. 1D) of 0.2 mm as indicated in Table 1, rapid heat transfer from the receiving plate 300 to the substrate carrier and the substrate is provided, whereas the temperature of the receiving plate 300 itself is hardly changed by the placement the substrate carrier.

It should be noted that the lateral dimensions as well as the heights of the recesses 311, 312*a*, 312*b* and 313*a* to 313*g* are dimensioned in such a way that the components of the substrate carrier can be received in the recesses of the receiving plate 30 without much play and at the desired temperature of the receiving plate 30 during a substrate treatment. In other words: The thermal expansion of the receiving plate 30 and the components of the substrate carrier at the desired temperature of the receiving plate 30 during the substrate treatment, the intention being that the substrate carrier has approximately the same temperature, is to be considered in the definition of the dimensions of the recesses. 'Without much play' means that a maximum distance of 0.5 mm is present in the lateral direction, i.e. in a horizontal direction, between a specific component of the substrate carrier and the edge of a corresponding recess in the receiving plate 30 at the temperature during the substrate treatment.

In FIG. 5C, the receiving plate 30 from FIG. 5A with a substrate carrier 10 according to the invention resting thereon and a substrate 2 arranged thereon can be seen in the same cross section as in FIG. 5B. As can be seen, the components of the substrate carrier 10 completely fill the recess 31 in the receiving plate 30 shown in FIG. 5B such that substantially no distance is present between the substrate carrier 10 and the base body 300 of the receiving plate 30, not even in a horizontal direction. This ensures optimal thermal and electrical contact between the receiving plate 30 and the substrate carrier 10 and thus also with the substrate 2. The holding area 11 is completely received in the recess 311 (shown in FIG. 5B), the holding devices 13*a* to 13*g*, of which only the holding device 13*a* can be seen in FIG. 5C, are completely received in the recesses 313*a* to 313*g* (shown in FIG. 5B) and the gripping arms 121 and 122 are completely received in the recesses 312*a* and 312*b* (shown in FIG. 5B) such that the first surface 112 of the holding area 11, the supporting surfaces of the holding devices 13*a* to 13*g* on which the substrate 2 rests and the first surface 301 of the receiving plate 30 form an even, closed surface. In other words: The receiving plate 30 and the substrate carrier 10 inserted therein form a nearly monolithic block on which the substrate 2 rests and from which only the holding devices 13*a* to 13*g* protrude in the vertical direction. Thus, the substrate 2 rests completely evenly and uniformly on the first surface 112 of the holding area 11, the holding devices 13*a* to 13*g* and the first surface 301 of the receiving plate 31 and can be treated homogeneously and without contaminating the substrate carrier 10 over a large area.

The receiving plate 30 preferably consists of an electrically conductive material, such as aluminium or graphite, such that a defined electrical potential can be homogeneously applied to the substrate carrier 10. However, the receiving plate 30 can consist of an electrically conductive material only in certain regions, for example in the regions adjacent to the substrate carrier 10, and in the region of the first surface 301, whereas other regions can consist of an electrically insulating material. It is also possible to use one or a plurality of electrically insulating materials for the entire base body 300 of the receiving plate 30 if it is not necessary to apply a defined potential to the substrate 2. Here, too, the temperature stability in the temperatures present during a treatment process must be taken into account in the choice of materials.

The relationship between the different regions 121a and 121b of the gripping arms 121 or 122 of the substrate carrier 10 and the receiving plate 30 will be explained again with reference to FIG. 5D. As can be seen, the first region 121a of the gripping arm 121 extends from the holding area 11 right up to the edge of the base body 300 along the second horizontal direction (y-axis) in which the gripping arm 121 extends beyond the holding area 11 and the receiving plate 30. In the first region 121a, the gripping arm 121 is preferably formed from the same material as the base body 300 of the receiving plate 30 such that, for example, an electrical voltage U that is applied to the base body 300 of the receiving plate 30 from the outside is also applied in the first region 121a of the gripping arm. Thus, even in regions where the base body 300 is not present on the surface adjoining a substrate treatment space, for example a plasma space, the same electrical conditions are given as in regions where the first surface 301 of the receiving plate forms said surface. This increases the homogeneity of the substrate treatment. In the second region 121b, which extends beyond the receiving plate 30, the gripping arm 121 preferably comprises an electrically insulating material such that the receiving plate 30 and the substrate treatment space are electrically insulated with respect to other elements of the apparatus for transporting a substrate, for example with respect to the carrier arrangement 14 shown in FIG. 1A.

The configurations of the receiving plate 30 and the substrate carrier 10, as described and illustrated above, allow ohmic contact between the receiving plate 30, the substrate carrier 10 and the substrate 2 when the individual components themselves consist of an electrically conductive material. With reference to FIG. 6, an embodiment of the components will be described that makes a capacitive coupling of the substrate 2 to the receiving plate 30 possible. In this case, a voltage U can be applied to the base body 300 from the outside again. However, the substrate carrier 10 is made of a dielectric material at least in regions that are directly adjacent to the substrate 2, i.e. in a first region 115a of the holding area 11 and in a first region 13aa of the holding device 13a, which is illustrated by way of example for all the holding devices 13a to 13g, and in first regions of the gripping arms 121, 122, which are in direct contact with the substrate 2. In other regions, i.e. in second regions 115b of the holding area 11 and in second regions 13ab of the holding device 13a as well as in second regions of the gripping arms 121, 122, the substrate carrier 10 is made of an electrically conductive material. The base body 300 of the receiving plate 30 also has a first region 300a in which it adjoins the substrate 2 and a second region 300b in which it does not adjoin the substrate 2, it also being possible for the first region 300a to extend beyond the substrate 2 as shown in FIG. 6. The first region 300a consists of a dielectric material, preferably the same dielectric material as the first regions 115a of the holding area 11 and the first regions 13aa of the holding device 13a and the first regions of the gripping arms 121, 122, whereas the second region 300b is formed from an electrically conductive material, preferably the same as the second regions 115b of the holding area and the second regions 13ab of the holding device 13a and the second regions of the gripping arms 121, 122. Thus, the substrate 2 is always adjacent to a dielectric material such that a capacitive coupling is achieved between the receiving plate 30 and the substrate 2. For example, aluminium oxide, silicon oxide, silicon nitride or other suitable materials as well as compounds or layer structures made of these materials are used as the dielectric material.

In addition to mechanically holding the substrate carrier and the substrate during the substrate treatment and, if applicable, applying a defined voltage to the substrate, as shown in FIGS. 5D and 6, the receiving plate can also fulfil other functions and be designed accordingly.

In a second embodiment, the receiving plate 30' is thus provided with a device 32 for controlling the temperature of the receiving plate as shown in FIG. 7A. The device 32 can be a heating and/or a cooling device and can, for example, consist of a resistive heater or a fluid guiding system through which heating or cooling fluids can flow. In this case, the device 32 can be arranged in the base body 300 of the receiving plate 30' and adjacent to a second surface 302 of the receiving plate 30', as shown in FIG. 7A, or completely enclosed by the base body 300, as shown in FIG. 7B. Moreover, it is also possible for the device not to be arranged in the base body 300 but only adjacent to the second surface 302. The second surface 302 is the surface of the receiving plate 30' that opposes the first surface 301 in which the recess 31 is formed. If high temperatures, i.e. temperatures greater than or equal to 400° C., are reached during the temperature control of the receiving plate 30', the temperature stability of the materials of the receiving plate 30' must be ensured when said materials are selected. For example, the receiving plate 30' can then comprise ceramic or quartz glass.

In a third embodiment, the receiving plate 30" is not only suitable for controlling the temperature of the receiving plate (as described with reference to FIG. 7A), but also has a device for supplying one or a plurality of gases. This is particularly advantageous for treatment apparatuses in which a plurality of receiving plates 30" are stacked vertically and in which the substrates are subjected to a treatment in which a defined gas composition is required in a treatment space. The device for supplying one or a plurality of process gases is, for example, a gas distributor 33 as shown in FIG. 7B. The gas distributor 33 has a gas supply space 331 that is filled with gas, for example, from the outside via a gas line and a plurality of gas channels 332 that provide a connection between the gas supply space 331 and the second surface 302 of the receiving plate 30". Thus, a gas can be introduced through the gas channels 332 from the gas supply space 331 into a substrate treatment space that is arranged below the receiving plate 30" in the vertical direction and assigned to a substrate that is positioned on another receiving plate arranged below the receiving plate 30" in the vertical direction.

FIG. 8A is a schematic representation of a treatment apparatus 3a according to the invention having a plurality of receiving plates 30a to 30d designed as plasma electrodes that are designed, for example, according to the first embodiment described with reference to FIG. 5A to 5D. In each case, a substrate carrier having a substrate arranged thereon is inserted into the receiving plates 30a to 30d. A substrate carrier 10a and a substrate 2a, which are inserted into the receiving plate 30a, are referenced by way of example. Each receiving plate 30a to 30d is a plasma electrode of a plasma electrode pair. As its uppermost plasma electrode, i.e. a plasma electrode arranged above all the other plasma electrodes in the vertical direction, the treatment apparatus 3a includes a top electrode 34 that has no recess like the other plasma electrodes, i.e. the receiving plates 30a to 30d, and is not provided and suitable for receiving a substrate during the substrate treatment. In such an arrangement of plasma electrodes, also referred to as an electrode unit, up to 200 electrodes, each arranged parallel to each other at a typical distance of 3 mm to 30 mm, are alternately connected to one of at least two voltage feed lines 35a, 35b, of which at least one is connected to a generator of a power supply that is installed outside the plasma treatment apparatus. One of the at least two voltage feed lines can also be earthed. The connection of the voltage feed lines 35a, 35b to the power supply is established via connecting terminals K1 and K2. When a corresponding voltage is applied between the plasma electrodes of a plasma electrode pair, it is thus possible to capacitively generate a plasma in a plasma space 36 that is located between these plasma electrodes. Using components generated in or present in the plasma, it is possible to treat the substrate resting on the respective receiving plate 30a to 30d, which forms the lower plasma electrode of the plasma electrode pair in the vertical direction.

FIG. 8B is a schematic representation of a treatment apparatus 3b according to the invention having a plurality of receiving plates 30e to 30h that allow the execution of CVD processes in a stacked arrangement for process temperatures up to 1000° C. In this case, a substrate carrier having a substrate arranged thereon is inserted into each receiving plate 30e to 30h. A substrate carrier 10a and a substrate 2a, which are inserted into the receiving plate 30e, are referenced by way of example. The receiving plates 30e to 30g are, similarly to the receiving plate 30" shown in FIG. 7B, made in two parts and comprise a suitable heater 32a (e.g. an electric resistance heater) in an upper half 303, into which heater the substrate carrier can be inserted with good thermal contact. A lower half 304 of each receiving plate 30e to 30g constitutes a gas distributor 33 (similar to FIG. 7B) that supplies a process space 36a thereunder with process gas. Further, an arrangement 37 for thermal insulation is arranged between the heater 32a and the gas distributor 33, which arrangement prevents the flow of heat from the heater 32a to the gas distributor 33 or at least greatly reduces it. The arrangement 37 for thermal insulation can comprise a plurality of heat shields, for example. The upper region 303 is heated to a first temperature that corresponds to the desired temperature of the substrate and the substrate carrier, for example 400° C. to 1000° C. The lower region 304 having the gas distributor 33 is kept at a significantly lower second temperature than the substrate and the substrate carrier, which can be done, for example, by means of internal cooling with cooling water. The CVD process can be carried out at atmospheric pressure or in vacuum at typical pressures of between 1 mbar (100 Pa) to 300 mbar (30 kPa). Due to their thermal decomposition on the hot substrate surface, CVD layer formation is achieved on the substrate by the process gases flowing out of the gas distributor 33 in the direction of the substrate arranged therebelow. The gas distributor 33, however, is not coated much or not coated at all.

Of course, separate gas distributors, i.e. gas distributors designed so as to be separate from the receiving plate, and corresponding receiving plates can be arranged alternately. As shown in FIG. 8B, an uppermost receiving plate in the vertical direction can be replaced by a separate gas distributor 33. By contrast, the lowermost receiving plate 33h in the vertical direction can have only the heater 32a as shown in FIG. 8B or only the heater 32a and the arrangement 37 for thermal insulation but not the gas distributor 33. However, all the receiving plates can be identical in design.

Furthermore, a treatment apparatus according to the invention can be any treatment apparatus that includes a receiving plate according to the invention and is suitable for treating a substrate. For example, such a treatment apparatus can be a temperature-control device in which a substrate is exposed to a defined ambient atmosphere at a defined temperature for a defined time.

The method according to the invention for processing a substrate will be explained with reference to FIG. 9. First, a substrate is placed onto a substrate carrier of an apparatus according to the invention for transporting a substrate by means known from the prior art in a first step S10. Subsequently, the substrate carrier is moved in at least one horizontal direction into a treatment apparatus that has a receiving plate on which the substrate is held during the treatment, wherein the substrate carrier is moved until the substrate carrier is located precisely above a receiving plate of the treatment apparatus in the vertical direction (step S20). Subsequently, the substrate carrier is placed on the receiving plate, for which purpose the substrate carrier is moved downwards in the vertical direction until the substrate carrier rests on top (step S30). In a subsequent step S40, the substrate, which rests on the receiving plate along with the substrate carrier, is treated as desired. After completion of the substrate treatment, the substrate carrier is lifted off the receiving plate by moving the substrate carrier upwards in the vertical direction (step S50) and then moved out of the treatment apparatus in at least one horizontal direction (step S60). Lastly, the substrate is removed from the substrate carrier using means known in the art (step S70) and can be supplied for further processing.

The steps S20 and S30 as well as the steps S50 and S60 can overlap in part chronologically, for example when a combined vertical and horizontal movement of the substrate carrier is carried out, for example a helical movement. However, this is only possible if the dimensions of the treatment apparatus allow this, in particular the vertical distance between the receiving plate and an element of the treatment apparatus or of a treatment system vertically arranged above said receiving plate, of which treatment system the treatment apparatus is a part and within which treatment system the treatment apparatus is arranged.

Moreover, it is possible to repeat the steps S20 to S60 a plurality of times, the substrate carrier in each case being moved into and out of another treatment apparatus and the substrate being treated accordingly. A treatment for plasma-chemical cleaning of a substrate surface can thus be carried out, for example, in a first treatment apparatus, whereas a treatment for depositing a layer on the substrate surface is carried out in a second treatment apparatus. In this case, it is possible to transport the substrate from one treatment apparatus to the next treatment apparatus without interrupting a vacuum, which may be necessary for the corresponding treatments.

Examples of the movements of the substrate carrier in the horizontal and vertical directions are shown with reference to FIG. 10A to 10C. FIGS. 10A and 10B each show schematic cross sections through a receiving plate 30 of a treatment apparatus according to the invention and through a substrate carrier 10 according to the invention having a substrate 2 arranged thereon, whereas FIG. 10C is a plan view of a receiving plate 30 of a treatment apparatus according to the invention and a substrate carrier 10 according to the invention having a substrate 2 arranged thereon. However, similar movements of the substrate carrier are also possible for receiving plates that have a planar surface and no recess that corresponds to the substrate carrier.

In the movement sequence shown in FIG. 10A, the substrate carrier 10 is first moved into the treatment apparatus along the first horizontal direction (x-axis), which is shown by the arrow V1, until the substrate carrier 10 is above the receiving plate 30 and, in particular, above the recess 31 formed in the receiving plate 30. Subsequently, the substrate carrier 10 is moved downwards (arrow V2) in the vertical direction (z-axis) until it rests in the recess 31 of the receiving plate 30. The substrate 2 is then treated. After the treatment is complete, the substrate carrier 10 is moved upwards in the vertical direction (arrow V3) until the substrate carrier 10 is lifted off the receiving plate 30 and is located above the receiving plate 30 in a vertical direction and at a distance therefrom that allows movement of the substrate carrier 10 in the horizontal direction without damaging the receiving plate 30 or the substrate carrier 10 or the substrate 2. Subsequently, the substrate carrier 10 is moved out of the treatment apparatus along the first horizontal direction (arrow V4). This movement sequence corresponds to a continuous process in which the substrate carrier 10 is moved into and out of the treatment apparatus in one and the same direction. It is particularly suitable for treatment apparatuses in which components of the treatment apparatuses, such as voltage and/or gas feed lines, are arranged only on at most one of the two sides of the receiving plate 30 that extend along the first horizontal direction (x-axis) and face each other in the second horizontal direction (y-axis). A small portion of these components can be arranged the two sides of the receiving plate 30 that extend along the second horizontal direction (y-axis) and face each other in the first horizontal direction (x-axis), but only to the extent that they do not hinder or impair the movements V1 and V4 of the substrate carrier 10.

The movement sequence shown in FIG. 10B differs from the movement sequence shown in FIG. 10A in that the horizontal movements V1 and V4 of the substrate carrier take place along the second horizontal direction (y-axis) in which the gripping arms of the substrate carrier 10 also extend. Because the gripping arms of the substrate carrier 10 are connected to a manipulator that is located, for example, to the right of the substrate carrier 10 in FIG. 10B but is not shown here, the substrate carrier 10 is moved into the treatment apparatus along a positive second horizontal direction (arrow V1) and out of the treatment apparatus again along a negative second horizontal direction (arrow V4). The positive second horizontal direction and the negative second horizontal direction are opposite each other. This movement sequence is particularly suitable for treatment apparatuses in which components of the treatment apparatuses, such as voltage and/or gas feed lines that hinder or interfere with a movement of the substrate carrier 10 along the first horizontal direction (x-axis), are arranged on at least one of the two sides of the receiving plate 30 that extend along the second horizontal direction (y-axis) and face each other in the first horizontal direction (x-axis).

The movement sequences described so far have only included rectilinear movements of the substrate carrier 10. With reference to FIG. 10C, another movement sequence is described that, in contrast, includes non-linear movements of the substrate carrier 10. Thus, the substrate carrier 10 is moved into the treatment apparatus by means of a rotating movement (arrow V1) that is performed in a horizontal plane above the receiving plate 30 and positioned above the receiving plate 30. Subsequently, the substrate carrier 10 is placed on the receiving plate 30 by means of a downward movement (V2) in the vertical direction (z-axis), the substrate 2 is treated and the substrate carrier 10 is lifted off the receiving plate 30 again by means of an upward movement (V3) in the vertical direction. Subsequently, the substrate carrier 10 is moved out of the treatment apparatus by means of a rotating movement (arrow V4) in a horizontal plane above the receiving plate 30. Here, too, other components of the treatment apparatus must be arranged in such a way that they do not hinder the movements of the substrate carrier 10, in particular the movements V1 and V4.

FIG. 11 is a schematic plan view of an embodiment of the treatment system 400 according to the invention. The treatment system 400 has a plurality of chambers arranged one behind the other along the first horizontal direction (x-axis) and is a continuous system (inline system) in which a substrate to be processed is transported from one chamber to the next chamber along the first horizontal direction. Preferably, the chambers are also all arranged in one and the same horizontal plane such that the substrate only has to be moved in the first horizontal direction to pass from one chamber into an adjacent chamber.

The treatment system 400 includes a loading chamber 410, an introduction chamber 420, a treatment chamber 430, a discharge chamber 440, and an unloading chamber 450. The loading chamber 410 and the unloading chamber 450 can be closed chambers that are delimited from their surroundings on all sides by chamber walls, slide valves or doors, as can be seen in FIG. 11. However, the loading chamber 410 and the unloading chamber 450 can also be open chambers or stations that are constantly open and non-delimited on at least one side with respect to their surroundings. The loading chamber 410 is suitable for making it possible to place a substrate 2 onto a substrate carrier of an apparatus according to the invention for transporting a substrate. For this purpose, the loading chamber 410 is suitable for receiving and holding such an apparatus for transporting a substrate. FIG. 11 shows, by way of example, an apparatus 1' for transporting a plurality of substrates as described with reference to FIG. 4A, the apparatus 1' including a plurality of substrate carriers and thus a plurality of holding areas 11 and gripping arms 121 and 122 that are connected to a common carrier arrangement 14. The loading chamber itself can contain means for placing the substrate onto the apparatus for transporting the substrate. Alternatively, such means for placing the substrate can also be arranged outside the loading chamber 410 and thus not be part of the treatment system 400, as shown in FIG. 11. Likewise, the unloading chamber 450 is suitable for allowing the removal of the substrate 2 from the substrate carrier of the apparatus 1' for transporting the substrate and for receiving and holding the apparatus 1'. With regard to means for removing the substrate from the apparatus for transporting the substrate, the same applies with respect to the means for placing the substrate onto the apparatus for transporting the substrate.

The introduction chamber 420 and the discharge chamber 440 are suitable for producing an atmosphere that corresponds to that of the subsequent chamber, i.e. the treatment chamber 430 or the unloading chamber 450, at least in some parameters (e.g. pressure). Thus, evacuation and aeration processes of the treatment chamber 430 and/or the loading and unloading chambers 410, 450 can be minimised. However, the functionality of the introduction and/or the discharge chambers 420, 440 can also be realised by the loading or unloading chamber 410, 450 or in the treatment chamber 430 such that the introduction and/or the discharge chambers 420, 440 can also be omitted.

The treatment chamber 430 is used for the actual treatment of the substrate 2 and includes at least one treatment apparatus having a receiving plate on which the substrate is held during the treatment. FIG. 11 as well as FIGS. 12A and 12B each show a treatment apparatus 3 according to the invention. However, the treatment chamber can also contain a treatment apparatus whose receiving plate is planar and has no recess corresponding to the substrate carrier of the apparatus according to the invention for transporting a substrate. The treatment apparatus 3 includes precisely as many receiving plates 30 as the apparatus 1' includes holding areas 11. In addition, the treatment apparatus 3 includes a supply device 38 that is suitable for providing and supplying media, such as gases or temperature-control fluids, or voltages that are necessary for the treatment of the substrate 2. In the embodiment shown, the supply device 38 is arranged in such a way within the treatment chamber 430 that the holding area 11 of the apparatus 1' can be moved into or out of the treatment apparatus 3 by means of a movement along the first horizontal direction (x-axis) and can be positioned above the receiving plate 30 without having to be additionally moved along the second horizontal direction (y-axis).

In the embodiment shown, at least the introduction chamber 420, the treatment chamber 430 and the discharge chamber 440 are vacuum chambers in which a defined atmosphere independent of the other chambers that is characterised by a certain pressure and a certain gas composition can be adjusted. All the chambers 410 to 450 are connected to the respectively adjacent chamber(s) by means of gastight slide valves 460. This makes it possible, for example, to transport the apparatus 1' from the introduction chamber 420 into the treatment chamber 430 or from the treatment chamber 430 into the discharge chamber 440 without interrupting a vacuum.

The treatment system 400 can also include a plurality of treatment chambers (or a plurality of treatment apparatuses in one treatment chamber) and/or a plurality of introduction and discharge chambers arranged and configured according to the desired overall processing of the substrate. In this case, a substrate can be processed in a plurality of treatment apparatuses without an intermediate transfer from one substrate carrier to another substrate carrier, the cross-contamination between the various treatment apparatuses being reduced.

As shown in FIG. 11, a plurality of apparatuses according to the invention for transporting a substrate can be present at the same time in the treatment system. Thus, for example, a first apparatus 1' can be located in the loading chamber 410 and can be supplied with substrates, whereas a second device 1' is located in the treatment chamber 430 and the substrates 2 located thereon are treated. Depending on the configuration of the treatment system 400, different numbers of apparatuses for transporting a substrate can be present in the treatment system at the same time. After the substrates are removed from the apparatus 1' for transporting a substrate within the unloading chamber 450, the empty apparatus 1' for transporting a substrate can be returned to the loading chamber 410 outside the treatment system 400 or in another region of the treatment system 400 such that it is available to process a substrate again. This will be explained in more detail later.

As already explained with reference to FIG. 4B, the apparatus according to the invention for transporting a substrate can also have a plurality of units of superposed substrate carriers, wherein said units are arranged laterally next to each other. Thus, for example, 120 substrates that are each arranged individually on one of the substrate carriers in six units of 20 substrates can be transported simultaneously through the treatment system and processed therein. In this case, a treatment apparatus can include so many units of superposed receiving plates, wherein said units are arranged laterally next to each other, that all the substrates can be treated in one and the same treatment apparatus. Alternatively, a plurality of treatment apparatuses that are preferably identical in design can also be present in a treatment chamber, only receiving plates for receiving the substrate carriers of one or a plurality of, but not all, units of substrate carriers with the substrates resting thereon being arranged in one of the treatment apparatuses in each case. Examples of such treatment chambers are shown schematically in FIGS. 12A and 12B.

FIG. 12A is a schematic plan view of a treatment chamber 430' having a treatment apparatus 3' and an apparatus for transporting a substrate having six units 101a to 101f of substrate carriers, a plurality of substrate carriers being vertically stacked in each unit 101a to 101f. The substrate carriers of all the units 101a to 101f are connected to one and the same carrier arrangement 14 and are connected to the carrier unit 471 and the guidance system 472 of the movement arrangement via said carrier arrangement. The treatment apparatus 3' has six units 305a to 305f of receiving plates, the receiving plates of a unit 305a to 305f each being stacked vertically. In addition, the treatment apparatus 3' contains a common supply device 38 that is suitable for providing and supplying media, such as gases or temperature-control fluids, or voltages that are necessary for the treatment of the substrates for all the units 305a to 305f. As a result, all the substrates are treated in one and the same treatment apparatus 3'.

FIG. 12B is a schematic plan view of a treatment chamber 430" having three treatment apparatuses 3"a to 3"c and an apparatus for transporting a substrate having six units 101a to 101f of substrate carriers, a plurality of substrate carriers being vertically stacked in each unit 101a to 101f. The substrate carriers of all the units 101a to 101f are connected to one and the same carrier arrangement 14 and are connected to the carrier unit 471 and the guidance system 472 of the movement arrangement via said carrier arrangement. The substrates of two each of the units 101a to 101f are treated in one of the treatment apparatuses 3"a to 3"c. That is, the substrates of the units 101a and 101b are treated in the treatment apparatus 3"a, the substrates of the units 101c and 101d are treated in the treatment apparatus 3"b and the substrates of the units 101e and 101f are treated in the treatment apparatus 3"c. For this purpose, each of the treatment apparatuses 3"a to 3"c has two units 305a and 305b of receiving plates, the receiving plates of a unit 305a and 305b each being vertically stacked. In addition, each of the treatment apparatuses 3"a to 3"c includes a supply device 38a to 38c that is suitable for providing and supplying media, such as gases or temperature-control fluids, or voltages that are necessary for the treatment of the substrates for each of the units 305a and 305b of one of the treatment apparatuses 3"a to 3"c. All the treatment apparatuses 3"a to 3"c are preferably identical in design.

Of course, arbitrary numbers of treatment apparatuses suitable for receiving arbitrary numbers of units of substrate carriers can be arranged in a treatment chamber.

Returning to FIG. 11, the treatment system 400 also includes a movement arrangement 470 that serves to move the apparatus 1' within the treatment system 400 and extends across the entire treatment system 400 through all the chambers 410 to 450. The movement arrangement 470 includes at least one carrier unit 471, at least one guidance system 472, as well as guide elements 473, a control unit 474 and a return system 475 in a region of the treatment system 400 that extends outside at least the treatment chamber 430. Using the return system 475, the carrier unit 471 and the associated guidance system 472, and possibly an empty apparatus 1' connected thereto for transporting a substrate, can be returned from the unloading chamber 450 to the loading chamber 410 such that they again are available to process a substrate. Thus, along with the other components of the movement arrangement 470, the return system 457 forms a closed system for moving the apparatus 1' to transport a substrate.

The return system 475 can have a design similar to that of the elements of the movement arrangement 470 within the chambers 410 to 450 and, for example, also have guide elements 473. However, the return system 475 can be of a different design and can have additional features such as a cleaning device. The return system 475 can be arranged arbitrarily with respect to the chambers 410 to 450 of the treatment system 400, for example above or below the chambers 410 to 450 or laterally thereof, but preferably always outside the chambers 410 to 450.

Preferably, transport devices, each of which includes a carrier unit 471 and a guidance system 472 having the fastened apparatus(es) 1' for transporting a substrate, are returned to the loading chamber 410 by means of the return system 475 after the substrate has been unloaded in the unloading chamber 450. The return system 475 for the transport devices can thus simultaneously serve as a buffer for the transport devices. That is, if enough transport devices (typically between 5 and 15) rotate in this manner in the treatment system, a queue for transport devices can be installed in the return system 475 upstream of the loading chamber 410. As a result, transport devices for loading substrates from the return system 475 can always be retrieved and the treatment system 400 can operate without interruption.

The control unit 474 serves to control the carrier unit 471 and the guide elements 473 as well as the return system 475 such that the apparatus 1' can be moved in a desired direction within the treatment system 400. The control and the means necessary for this purpose, such as signal lines or mechanical, hydraulic or pneumatic control elements, are schematically represented by the arrows that, by way of example, lead from the control unit 474 to some guide elements 473, to the carrier unit 471 and to the return system 475. The guide elements 473 are arranged in the respective chambers 410 to 450, whereas the carrier unit 471 and the guidance system 472 are connected to the apparatus 1' and move through the treatment system 400 together with said apparatus. The guidance system 472 cooperates with the guide elements 473 in such a way that the apparatus 1' is held and can be moved along the first horizontal direction (x-axis) in a defined manner. In this case, the individual guide elements 473 have a distance along the first horizontal direction (x-axis) from each other that is dimensioned in such a way that the carrier unit 471 is always held at each location within the treatment system 400 by at least two guide elements 473.

FIG. 13 is a cross section through the treatment system 400 along the line F-F' from FIG. 11 and serves to explain an exemplary embodiment of the movement arrangement 470, in particular the carrier unit 471, the guidance system 472 and the guide elements 473. The apparatus 1' for transporting a substrate, which includes a plurality of substrate carriers 10a to 10d and the carrier arrangement 14, as well as the movement arrangement 470, the control unit not being shown, and a lateral chamber wall 411 of the loading chamber 410 can be seen. Other walls of the loading chamber 410 are not shown here in the interest of better clarity of the illustration. The carrier unit 471 is a vertically extending plate that, on its side facing away from the chamber wall 411, is fixedly connected to the carrier arrangement 14 with respect to movement in the first horizontal direction (along the x-axis) and movably connected to said carrier arrangement in the vertical direction (z-axis). In each case, the connection can be made in a detachable or non-detachable manner. The carrier unit 471 is suitable for moving the carrier arrangement 14 in a defined manner along the vertical direction and has the means necessary for this purpose. These means can implement a vertical movement of the carrier arrangement 14 electrically, mechanically, hydraulically or pneumatically and are known from the prior art. In addition, the carrier unit 471 can also include means that make it possible for carrier arrangement 14 to move along the second horizontal direction (y-axis) in a defined manner. An upper rail 472a and a lower rail 472b are fixedly arranged on the side of the carrier unit 471 facing the chamber wall 411, the upper and the lower rail 472a, 472b together forming the guidance system 472 from FIG. 11. The upper and the lower rail 472a, 472b are each mounted on a roller 476a, 476b, each of which is, in turn, arranged on a shaft 477a, 477b. Preferably, at least one of the rollers 476a, 476b is fixedly connected to the shaft 477a, 477b associated therewith. In this case, 'fixedly' means that the respective components are connected to each other in such a way that they cannot move towards each other or independently of each other, it being possible for the connection to be designed so as to be detachable per se, for example, by means of screws, or non-detachable, for example by means of welding. The shafts 477a, 477b pass through the chamber wall 411 and can thus be rotated from the outside, as a result of which the rollers 476a, 476b rotate and move the carrier unit 471 having the apparatus 1' connected thereto along the first horizontal direction (x-axis). The rollers 476a, 476b can also be rotatably mounted on the shafts 477a, 477b so as only to passively support moving the carrier unit 471 along the first horizontal direction. The movement of the carrier unit 471 along the first horizontal direction itself can then be induced and controlled via other means. The roller 476a and the shaft 477b, which cooperate with each other, together form an upper guide element 473a, whereas the roller 476b and the shaft 477b form a lower guide element 473b. The rails 472a, 472b extend substantially rectilinearly along the first horizontal direction (x-axis), it being possible at least for front ends of the rails 472a, 472b, i.e. the end regions of the rails 472a, 472b that first come into contact with a roller 476a, 476b in the moving direction of the carrier unit 471, to be rounded or curved upwards in a vertical direction to achieve an impact-free transition of the respective rail 472a, 472b onto the respective roller 476a, 476b.

Of course, other embodiments of the individual components of the movement arrangement 470, in particular the carrier unit 471, the guidance system 472 and/or the guide elements 473, are possible as long as it is ensured that the apparatus 1' is held securely and moved in a defined manner.

At high temperatures that occur in at least one of the chambers of the treatment system, as is the case, for example, in a treatment chamber that is used for an MOCVD (metalorganic chemical vapour deposition), arrangements for thermal insulation of the movement arrangement 470 or other components of the relevant chamber may be necessary and present, which arrangements are, however, not shown in FIGS. 11 to 13 for the sake of clarity. MOCVD processes are carried out, for example, at substrate temperatures between 600° C. and 1000° C., whereas plasma-assisted processes are usually carried out at substrate temperatures between 20° C. and 400° C. Such arrangements for thermal insulation are, for example, heat shields or coatings and are known from the prior art.

In other embodiments of the treatment system according to the invention, the loading chamber and the unloading chamber can also be realised by one and the same chamber, it being possible to linearly arrange the chambers that are then present, but a movement of the substrate being necessary in a positive and negative direction along the first horizontal direction.

In addition, vertically stacked configurations of the chambers or a circular configuration of the chambers or of some chambers around a central loading and unloading chamber are also possible.

The precise configuration of the substrate carrier and the entire apparatus for transporting a substrate as well as the precise design of the receiving plate and the entire treatment apparatus can be optimally adapted to the conditions of a substrate treatment and a movement of the substrate carrier. In particular, the shape and number of the holding areas, the gripping arms and the holding devices as well as the shape and number of recesses in the receiving plate and the receiving plates themselves can be chosen independently of the illustrated embodiments and are not limited to the shapes and numbers shown. Combinations of various components of the illustrated embodiments are possible as long as they are not mutually exclusive.

In the same way, different components of the treatment system can be combined with each other as long as they are not mutually exclusive.

REFERENCE SIGNS 1, 1', 1" Apparatus for transporting a substrate
10, 10', 10", Substrate carrier
10a-10d, 100
101, 101a-Unit of vertically stacked substrate carriers
101f
11, 11a, 11d Holding area
110 Base body of the substrate carrier
110a, 110d Recess in the base body
111 Edge of the holding area
112 First surface of the holding area
113 Second surface of the holding area
114a Side frame of the holding area
114b Web between the recesses of the holding area
115a First region of the holding area
115b Second region of the holding area
121, 122 Gripping arm
121a First region of the gripping arm
121b Second region of the gripping arm
13a-13g Holding device
14 Carrier arrangement
2, 2a-2d Substrate
201 First surface of the substrate
202 Second surface of the substrate
203 Edge of the substrate
3, 3a, 3b, 3', Treatment apparatus
3"a-3"c
30, 30', 30", Receiving plate
30a-30h
300 Base body of the receiving plate
300a First region of the base body
300b Second region of the base body
301 First surface of the receiving plate
302 Second surface of the receiving plate
303 Upper region of the receiving plate
304 Lower region of the receiving plate
305a-305f Unit of receiving plates
31 Recess in the receiving plate
311 Recess for receiving the holding area
312a, 312b Recess for receiving a gripping arm
313a-313g Recess for receiving a holding device
32 Device for controlling the receiving plate temperature
32a Heater
33 Gas distributor
331 Gas supply space
332 Gas channel
34 Top electrode
35a, 35b Voltage feed line
36 Plasma space
36a Process space
37 Arrangement for thermal insulation
38, 38a-38c Supply device
400 Treatment system
410 Loading chamber
411 Chamber wall
420 Introduction chamber
430, 430', Treatment chamber
430"
440 Discharge chamber
450 Unloading chamber
460 Slide valve
470 Movement arrangement for moving the apparatus for transporting a substrate
471 Carrier unit
472 Guidance system
472a Upper rail
472b Lower rail
473 Guide element
473a Upper guide element
473b Lower guide element
474 Control unit
475 Return system
476a, 476b Roller
477a, 477b Shaft
K1, K2 Connecting terminal
V1-V4 First to fourth movement of the substrate carrier
$b_1$ Width of the substrate
$b_{11}$ Width of the holding area
$b_{12}$ Width of the gripping arm
$b_{13}$ Width of the projecting region of the holding device
$h_1$ Height of the substrate
$h_{11}$ Height of the holding area
$h_{12}$ Height of the gripping arm in regions where it is not adjacent to the second surface of the holding area
$h_{12'}$ Height of the gripping arm in regions where it is adjacent to the second surface of the holding area
$h_{13}$ Height of the holding device above the first surface of the holding area
$h_{311}$ Height of the recess for receiving the holding area
$h_{312}$ Height of the recess for receiving a gripping arm
$L_1$ Length of the substrate
$L_{11}$ Length of the holding area
$L_{12}$ Length of the gripping arm
$L_{12a}$ Length of the projecting region of the first region of the gripping arm
$L_{12b}$ Length of the second region of the gripping arm
$L_{13}$ Length of the holding device

The invention claimed is:

1. A transport apparatus of a treatment apparatus for transporting a substrate into or out of a treatment chamber of the treatment apparatus, the treatment chamber having a horizontally extending receiving plate and the transport apparatus having a substrate carrier configured to transport the substrate into the treatment chamber and position the substrate on a first surface of the receiving plate, wherein the substrate carrier is further configured to hold the substrate on the receiving plate during the treatment of the substrate in the treatment chamber, and the substrate carrier comprises:

a horizontally extending holding area configured to retain the substrate thereon formed of an even and uniform first surface that faces the substrate, the holding area being configured such that the shape of said holding area substantially corresponding to the shape of a rear side of the substrate and the area size of said holding area being substantially the same as the area size of the rear side of the substrate, the holding area being configured such that the substrate is held with its whole rear side in engagement with the holding area merely by its weight, and one or a plurality of gripping arms, each of the gripping arms being connected to the holding area and extending beyond said holding area in a horizontal direction, wherein the substrate carrier is configured such that the substrate is retained on the holding area during said transporting the substrate into or out of the treatment apparatus, with the entirety of the rear side of the substrate resting on the holding area, and wherein the entirety of the substrate carrier is configured to reside within the treatment chamber during treatment of the substrate by the treatment apparatus.

2. The transport apparatus according to claim 1, wherein at least two holding devices extend at least in the vertical direction from the edge and/or from the first surface of the holding area, which holding devices are suitable for securing the substrate against lateral displacement on the holding area.

3. The transport apparatus according to claim 2, wherein the holding devices extend across the first surface of the holding area up to a height measured from the first surface of the holding area, the height being greater than zero and less than or equal to the height of the substrate.

4. The transport apparatus according to claim 1, wherein the substrate carrier has a plurality of holding areas that are arranged next to each other in a lateral arrangement in a common horizontal plane and are physically connected to each other, wherein each holding area is suited for holding one substrate.

5. The transport apparatus according to claim 4, wherein the substrate carrier has a closed base body, each holding area being designed as a base surface of a recess formed in a horizontal surface of the base body, and holding devices that are suitable for securing substrates, each of which rests on one of the holding areas, against lateral displacement on the respective holding area and are formed as a side frame or as a web between the holding areas.

6. The transport apparatus according to claim 1, wherein components of the substrate carrier that are in contact with the substrate and/or the receiving plate during the substrate treatment comprise the same material as the first surface of the receiving plate at least in regions that are in contact with the substrate and/or the receiving plate during the substrate treatment.

7. The transport apparatus according to claim 1, wherein: (a) components of the substrate carrier that are in contact with the substrate and/or the receiving plate during the substrate treatment comprise an electrically conductive material in regions that are in contact with the substrate and/or the receiving plate during the substrate treatment, and the gripping arm(s) comprise(s) a dielectric material in regions that are not in contact with the receiving plate during the substrate treatment; (b) the regions of the substrate carrier that are in contact with the substrate(s) and/or the receiving plate during the substrate treatment have a heat capacity that is smaller than the heat capacity of the receiving plate;

or (c) the transport apparatus comprises a carrier arrangement on which the substrate carrier is fastened to by the one or more gripping arms.

8. The transport apparatus according to claim 7, wherein, with respect to item (c), the transport apparatus comprises a unit of a plurality of substrate carriers that are vertically stacked and connected to the carrier arrangement.

9. The transport apparatus according to claim 8, wherein the apparatus comprises a plurality of units of vertically stacked substrate carriers, the units being arranged next to each other in the horizontal direction and connected to the same carrier arrangement.

10. The transport apparatus according to claim 7, wherein: (c) the transport apparatus comprises a carrier arrangement on which the substrate carrier is fastened to by the one or more gripping arms, and wherein the one or more gripping arms of the substrate carrier are fastened to the carrier arrangement and the holding area is detachably connected to the one or more gripping arms and lies on the one or more gripping arms.

11. The transport apparatus according to claim 1, wherein the gripping arms extend below a bottom side of a holding portion of the substrate carrier that comprises the holding area.

12. The transport apparatus according to claim 1, wherein the receiving plate includes a first recessed portion of a first depth and a second recessed portion of a second depth that is different than the first depth, and wherein the one or more gripping arms are configured to reside within the second recessed portion and a holding portion of the substrate carrier that comprises the holding area is configured to reside within the first recessed portion.

13. The transport apparatus according to claim 1, wherein the transport apparatus comprises a plurality of substrate carriers to form a unit that is configured to retain a plurality of substrates on holding areas of the plurality of the substrate carriers, and wherein the entirety of the unit is configured to reside within the treatment chamber during treatment of the plurality of the substrates.

14. A method of processing a substrate in a treatment system, the treatment system including the treatment apparatus that includes the transport apparatus of claim 1, comprising the following steps:
a) placing the substrate onto the substrate carrier of the transport apparatus for transporting a substrate,
b) moving the substrate carrier in at least one horizontal direction until the substrate carrier is arranged above the receiving plate of the treatment apparatus in a vertical direction,
c) placing the substrate carrier on the receiving plate,
d) treating the substrate in the treatment chamber of the treatment apparatus,
e) lifting the substrate carrier off the receiving plate in the vertical direction,
f) moving the substrate carrier out of the treatment chamber of the treatment apparatus in at least one horizontal direction, and
g) removing the substrate from the substrate carrier, the steps being performed in the order specified.

15. The method according to claim 14, wherein the treatment system comprises a plurality of treatment apparatuses and steps b) to f) are carried out a plurality of times in succession, the substrate being successively introduced into and removed from treatment chambers of the plurality of the treatment apparatuses and treated therein.

16. The method according to claim 15, wherein steps b) to f), which are performed a plurality of times in succession, are performed without interrupting a vacuum in the treatment system.

17. The method according to claim 14, wherein the substrate carrier is placed in a recess of the receiving plate in step c).

* * * * *